(12) United States Patent
Furuta et al.

(10) Patent No.: US 6,598,198 B1
(45) Date of Patent: Jul. 22, 2003

(54) DEINTERLEAVING DEVICE THAT RELEASES A PLURALITY OF TYPES OF INTERLEAVING SIMULTANEOUSLY

(75) Inventors: Akihiro Furuta, Kadoma (JP); Kaoru Iwakuni, Nabari (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/350,481

(22) Filed: Jul. 9, 1999

(30) Foreign Application Priority Data

Jul. 10, 1998 (JP) .......................... 10-196342

(51) Int. Cl.$^7$ .......................... G11C 29/00; G06F 12/00
(52) U.S. Cl. ........................ 714/763; 711/157
(58) Field of Search ................... 714/763, 761, 714/762, 752; 341/81; 711/157

(56) References Cited

U.S. PATENT DOCUMENTS

| 4,881,241 A | 11/1989 | Pommier et al. |
| 5,191,576 A | 3/1993 | Pommier et al. |
| 5,327,227 A | * 7/1994 | Han .......................... 348/489 |
| 5,636,224 A | * 6/1997 | Voith et al. ................ 711/154 |
| 5,991,857 A | * 11/1999 | Koetje et al. .............. 711/154 |
| 6,185,200 B1 | * 2/2001 | Prasad ........................ 370/320 |

FOREIGN PATENT DOCUMENTS

| EP | 0 740 437 | 10/1996 |
| JP | 8-316933 | 11/1996 |
| JP | 9-509818 | 9/1997 |
| JP | 9-509819 | 9/1997 |

* cited by examiner

Primary Examiner—Albert Decady
Assistant Examiner—Esaw Abraham
(74) Attorney, Agent, or Firm—RatnerPrestia

(57) ABSTRACT

The deinterleaving device of this invention deinterleaves an input transmission frame and outputs the deinterleaved frame, the transmission frame being obtained by performing inter-frame interleaving for an original frame to form an intermediate frame and performing inner-segment interleaving for at least one data segment included in the intermediate frame. The deinterleaving device includes: a memory; a data write section for receiving the transmission frame and writing the transmission frame into the memory; and a data read section for releasing the inter-frame interleaving and the inner-segment interleaving simultaneously when reading data from the memory and outputting the data.

30 Claims, 17 Drawing Sheets

FIG.3

| | | | | | | Intermediate frame (No. of data 57600) | | | | |
|---|---|---|---|---|---|---|---|---|---|---|
| Zeroth frame | a(0,0) | a(-8,1) | a(-4,2) | a(-12,3) | a(-2,4) | a(-10,5) | a(-6,6) | ... | a(-7,57598) | a(-15,57599) |
| 1st frame | a(1,0) | a(-7,1) | a(-3,2) | a(-11,3) | a(-1,4) | a(-9,5) | a(-5,6) | ... | a(-6,57598) | a(-14,57599) |
| 2nd frame | a(2,0) | a(-6,1) | a(-2,2) | a(-10,3) | a(0,4) | a(-8,5) | a(-4,6) | ... | a(-5,57598) | a(-13,57599) |
| 3rd frame | a(3,0) | a(-5,1) | a(-1,2) | a(-9,3) | a(1,4) | a(-7,5) | a(-3,6) | ... | a(-4,57598) | a(-12,57599) |
| 4th frame | a(4,0) | a(-4,1) | a(0,2) | a(-8,3) | a(2,4) | a(-6,5) | a(-2,6) | ... | a(-3,57598) | a(-11,57599) |
| 5th frame | a(5,0) | a(-3,1) | a(1,2) | a(-7,3) | a(3,4) | a(-5,5) | a(-1,6) | ... | a(-2,57598) | a(-10,57599) |
| 6th frame | a(6,0) | a(-2,1) | a(2,2) | a(-6,3) | a(4,4) | a(-4,5) | a(0,6) | ... | a(-1,57598) | a(-9,57599) |
| 7th frame | a(7,0) | a(-1,1) | a(3,2) | a(-5,3) | a(5,4) | a(-3,5) | a(1,6) | ... | a(0,57598) | a(-8,57599) |
| 8th frame | a(8,0) | a(0,1) | a(4,2) | a(-4,3) | a(6,4) | a(-2,5) | a(2,6) | ... | a(1,57598) | a(-7,57599) |
| 9th frame | a(9,0) | a(1,1) | a(5,2) | a(-3,3) | a(7,4) | a(-1,5) | a(3,6) | ... | a(2,57598) | a(-6,57599) |
| 10th frame | a(10,0) | a(2,1) | a(6,2) | a(-2,3) | a(8,4) | a(0,5) | a(4,6) | ... | a(3,57598) | a(-5,57599) |
| 11th frame | a(11,0) | a(3,1) | a(7,2) | a(-1,3) | a(9,4) | a(1,5) | a(5,6) | ... | a(4,57598) | a(-4,57599) |
| 12th frame | a(12,0) | a(4,1) | a(8,2) | a(0,3) | a(10,4) | a(2,5) | a(6,6) | ... | a(5,57598) | a(-3,57599) |
| 13th frame | a(13,0) | a(5,1) | a(9,2) | a(1,3) | a(11,4) | a(3,5) | a(7,6) | ... | a(6,57598) | a(-2,57599) |
| 14th frame | a(14,0) | a(6,1) | a(10,2) | a(2,3) | a(12,4) | a(4,5) | a(8,6) | ... | a(7,57598) | a(-1,57599) |
| 15th frame | a(15,0) | a(7,1) | a(11,2) | a(3,3) | a(13,4) | a(5,5) | a(9,6) | ... | a(8,57598) | a(0,57599) |

…

DEINTERLEAVING DEVICE THAT RELEASES A PLURALITY OF TYPES OF INTERLEAVING SIMULTANEOUSLY

BACKGROUND OF THE INVENTION

1. Field of the Invention

The present invention relates to a device for deinterleaving interleaved digital transmission data, and more particularly, to a deinterleaving device which releases a plurality of types of interleaving simultaneously.

2. Description of the Related Art

In recent years, digitalization in broadcasting technology has been in rapid progress. For example, terrestrial digital audio broadcasting employing a transmission method called orthogonal frequency division multiplex (OFDM) has been realized. In such a broadcasting method, in general, (1) an audio signal is coded after an error correction code is added thereto, (2) the coded data is divided into blocks (normally called "frames") of a predetermined length, and (3) each frame is constructed of a plurality of OFDM symbols. In addition to the above, processing steps of (4) rearranging data between frames (time interleave) and (5) changing the order of sub-carriers in a symbol (frequency interleave) may be performed. By combining the two types of interleave (4) and (5) with error correction, the audio signal can be substantially restored to its original state even if continuous data on a time axis and a frequency axis are partially missing.

If such radio wave is reflected from a tall building, a mountain, and the like during reception of broadcasting, the frequency characteristic of a transmission path is no longer flat, causing a degradation of a received signal, called multi-path interference, in some cases. In such cases, the receiving power of continuous sub-carriers on a frequency axis drops simultaneously (frequency selective phasing). Therefore, if frequency interleaving is not performed, data error tends to occur in bursts, and thus the effect of an error correction code is unlikely to be obtained. Also, in the case of reception of broadcasting in a moving car and the like, impulse-like noise from an ignition plug of an engine and the like and instantaneous reduction of the electric field intensity may possibly occur. In order to avoid influences from such occurrences, interleave on a time axis is also required.

For the above reasons, time and frequency interleaves are indispensable for digital broadcasting employing the OFDM method. Receivers of such broadcasting are therefore required to include a function of deinterleaving. For example, Japanese Laid-Open Publication No. 8-316933 and Japanese National Phase PCT Laid-Open Publication No. 9-509818 and No. 9-509819 disclose a same construction of a receiver for digital audio broadcasting (hereinbelow, abbreviated as DAB) which has a function of releasing time and frequency interleaves.

In Japanese National Phase PCT Laid-Open Publication No. 9-509819 (see FIG. 2 of this publication), for example, frequency interleave is released when an output of a demodulator DEM is written in a demodulator output buffer DOB. The resultant data is temporarily written in a first section of a time deinterleave memory TDM(1). The frequency-deinterleaved data is then returned to the demodulator output buffer DOB and written this time in a second section of the time deinterleave memory TDM(2). During this writing of data in TDM(2), time interleave is released. The resultant data released from both time and frequency interleaves is then transferred to a deinterleaver output buffer (IOB) and then input to a Viterbi decoder DEC for error correction.

In general, delay occurs when serial data is interleaved. In order to deinterleave, it is necessary to provide a memory device for temporarily storing standby data during the delay time. Such a memory device is generally a semiconductor memory such as a DRAM, an SRAM, and a register. In the above exemplified receiver for DAB, the demodulator output buffer DOB for releasing frequency interleave and the first section of the time deinterleave memory TDM(1) for releasing time interleave correspond to the memory device for temporarily storing data described above. The interleave-specific delay of time interleave is enormously larger than that of frequency interleave. Accordingly, while the memory capacity of DOB is 12 kbits, that of TDM is as large as 1,024 kbits (1 kbit=1,024 bits). In this case, it should be noted that the memory capacity of the time deinterleave memory TDM is limited on the assumption that only part of a plurality of multiplexed services in a DAB signal is demodulated.

If the output data rate (output speed) after deinterleaving is not matched with the input data rate of an error corrector, a storage device called a buffer (normally, a memory) is required to achieve matching of these rates. Some error correctors read data intermittently depending on the error correction coding method. In general, therefore, the above two data rates are not matched with each other. In the above exemplified receiver for DAB, the second section of the time deinterleave memory TDM(2) and the deinterleaver output buffer IOB serve to match the data rates.

The above conventional device requires high-speed and complicated processing, which is not easily realized by a general purpose processor. Such processing is normally performed by an exclusive signal processing LSI (large scale integrated circuit). As of today, however, it is not preferable economically to mount a large-capacity memory such as the time deinterleave memory in a signal processing LSI. Therefore, the conventional deinterleaving device as described above has a construction that a general external large-capacity memory is added to an exclusive signal processing LSI.

The above conventional receiver for DAB has the following problems. Since frequency and time interleaves are separately released, respective memories for releasing these interleaves are required. If a memory for frequency interleave and an output buffer are incorporated in a signal processing LSI, production cost of the LSI increases since memories normally occupy a large area on a chip. In the case where such memory and buffer are not incorporated in the LSI, external memories are separately required, resulting in increasing the cost of the receiver.

In reality, it is possible to release both time and frequency interleaves using a single external memory. For example, data may be written in a memory so that the data is arranged in a state that frequency interleave has been released, and time interleave may be released when the data is read. In this construction, however, access to random addresses is performed in the memory during both write and read operations. In such random access, if the input/output data rates are high, a DRAM having long random read/random write times fails to catch up with the processing speed.

Hereinbelow, the processing speed will be described, taking as an example a receiver of a DAB signal used in broadcasting in Europe. In European DAB standards, the coding rate to an original code is 1/4 at minimum. In order to obtain an output data rate of 1.536 Mbps after error correction, an output data rate of four times the above data rate, i.e., 4.096 MHz, is required after deinterleaving. The input data rate is 4.096 MHz, and the average of the input/output data rates is 5.12 MHz.

The random read or random write cycle time is 110 ns for a standard DRAM having an access time of 60 ns. Therefore, since 220 ns is required for one random read/random write, it is not possible to obtain an average input/output data rate equal to or more than 4.545 MHz (=1/220 ns). In order to obtain the output data rate of 6.144 MHz, it is necessary to temporarily store data in a buffer (i.e., a large-capacity memory) before being output or to use an SRAM and the like capable of realizing high-speed random access, in place of the DRAM. However, using a buffer increases production cost of the LSI, and an SRAM has a high cost per bit compared with a DRAM.

SUMMARY OF THE INVENTION

The deinterleaving device of this invention deinterleaves an input transmission frame and outputs the deinterleaved frame, the transmission frame being obtained by performing inter-frame interleaving for an original frame to form an intermediate frame and performing inner-segment interleaving for at least one data segment included in the intermediate frame. The deinterleaving device includes: a memory; a data write section for receiving the transmission frame and writing the transmission frame into the memory; and a data read section for releasing the inter-frame interleaving and the inner-segment interleaving simultaneously when reading data from the memory and outputting the data.

In one embodiment of the invention, the data write section receives data in a plurality of transmission frames and writes the data into the memory, and the data read section determines the order of the data in each of the transmission frames in a state where the inter-frame interleaving and the inner-segment interleaving are released by calculating backward a rearranging rule of the inner-segment interleaving and a rearranging rule of the inter-frame interleaving, reads the data from the memory in the determined order, and outputs the data.

In another embodiment of the invention, the data write section includes: a data counter for counting the number of data in a transmission frame; a frame counter for counting the number of transmission frames; a first frame head address generator for generating an address in the memory at which head data of the transmission frame is to be stored based on a value of the frame counter; and a first adder for summing a value of the data counter and an output value of the first frame head address generator and outputting the result as an address in the memory.

In still another embodiment of the invention, the data read section includes: a counter for counting the number of data read requests; a second frame head address generator for generating an address in the memory at which the head data of the transmission frame is stored based on a value of the counter and a value of the frame counter of the data write section; a ROM for storing a rearranging rule of the inner-segment interleaving; a first operator for calculating a data segment to which desired output data belongs; a second operator for calculating a relative position of the desired output data in the data segment using the ROM; and a second adder for summing output values of the second frame head address generator, the first operator, and the second operator and outputting the result as an address in the memory.

In still another embodiment of the invention, the transmission frame includes, at a stage of the intermediate frame, a data segment for which the inter-frame interleaving has been performed and a data segment for which the inter-frame interleaving has not been performed, the data write section writes the data segment for which the inter-frame interleaving has been performed and the data segment for which the inter-frame interleaving has not been performed at different storage positions of the memory, and the data read section releases the inter-frame interleaving and the inner-segment interleaving simultaneously for the data segment for which the inter-frame interleaving has been performed when reading data from the memory and outputs the data, while the data read section releases the inner-segment interleaving for the data segment for which the inter-frame interleaving has not been performed when reading data from the memory and outputs the data.

In still another embodiment of the invention, the data segments are transmitted via sub-carriers included in at least one symbol constituting orthogonal frequency division multiplex, and the transmission frame includes a plurality of symbols constituting orthogonal frequency division multiplex.

In still another embodiment of the invention, the memory is a DRAM having a fast page mode, and the data write section writes at least two consecutive data in the transmission frame into continuous addresses in the DRAM in the fast page mode.

In still another embodiment of the invention, the data segment is transmitted via sub-carriers included in at least one symbol constituting orthogonal frequency division multiplex, a guard interval is added to the symbol constituting orthogonal frequency division multiplex, the transmission frame includes a plurality of symbols constituting orthogonal frequency division multiplex, an orthogonal frequency division multiplex demodulator is connected upstream of the deinterleaving device, and refresh operation of the DRAM is performed during the guard interval.

Alternatively, the deinterleaving device of this invention deinterleaves an input transmission frame and outputs the deinterleaved frame, the transmission frame being obtained by performing inter-frame interleaving for an original frame to form an intermediate frame and performing inner-segment interleaving for at least one data segment included in the intermediate frame. The deinterleaving device includes: a memory; a data write section for releasing the inter-frame interleaving and the inner-segment interleaving simultaneously when writing data in the memory; and a data read section for reading data from the memory and outputting the data.

In one embodiment of the invention, the data write section receives data in a plurality of transmission frames, determines the order of the data in each of the transmission frames in a state where the inter-frame interleaving and the inner-segment interleaving are released by calculating backward a rearranging rule of the inner-segment interleaving and a rearranging rule of the inter-frame interleaving, and writes the data in the memory in the determined order.

In another embodiment of the invention, the data segments are transmitted via sub-carriers included in at least one symbol constituting orthogonal frequency division multiplex, and the transmission frame includes a plurality of symbols constituting orthogonal frequency division multiplex.

In still another embodiment of the invention, the memory is a DRAM having a fast page mode, and the data write section writes at least two consecutive data in the transmission frame at continuous addresses in the DRAM in the fast page mode.

In still another embodiment of the invention, the data segment is transmitted via sub-carriers included in at least one symbol constituting orthogonal frequency division multiplex, a guard interval is added to the symbol constituting orthogonal frequency division multiplex, the transmission frame includes a plurality of symbols constituting orthogonal frequency division multiplex, an orthogonal frequency division multiplex demodulator is connected upstream of the deinterleaving device, and refresh operation of the DRAM is performed during the guard interval.

Alternatively, the deinterleaving device of this invention deinterleaves an input transmission frame and outputs the deinterleaved frame, the transmission frame being obtained by performing inter-frame interleaving for an original frame including at least one channel to form an intermediate frame multiplexed by allocating the channel at a predetermined channel start position and performing inner-segment interleaving for at least one data segment included in the intermediate frame. The deinterleaving device includes: a memory; a data write section for writing the transmission frame into the memory; and a data read section for releasing the inter-frame interleaving and the inner-segment interleaving for data in the channel simultaneously by referring to the channel start position of the channel when the channel start position is designated during reading of data from the memory, and outputting the data of the channel.

In one embodiment of the invention, the data write section receives data in a plurality of transmission frames and stores the data in the memory, and the data read section determines the order of the data in each of the transmission frames in a state where the inter-frame interleaving and the inner-segment interleaving are released by calculating backward a rearranging rule of the inner-segment interleaving and a rearranging rule of the inter-frame interleaving, reads the data in the memory in the determined order, and outputs the data.

In another embodiment of the invention, the data read section calculates a storage position of data in the memory based on the channel start position and the number of data read requests when the channel start position is designated during reading of data from the memory.

In still another embodiment of the invention, the data read section includes: a register for storing the channel start position; a counter for counting the number of data read requests; and an operator for calculating the storage position of data in the memory based on values of the register and the counter.

In still another embodiment of the invention, during reading of data from the memory, when the data read section receives a channel multiplexing construction change signal indicating a change of a channel multiplexing construction of the original frame, the data read section releases the inter-frame interleaving and the inner-segment interleaving for data in the channel simultaneously by referring to an old channel start position before the receipt of the channel multiplexing construction change signal and a new channel start position after the receipt of the channel multiplexing construction change signal, and outputs the data of the channel.

In still another embodiment of the invention, when the data read section receives the channel multiplexing construction change signal, the data read section selects one of the old channel start position and the new channel start position based on the old and new channel start positions, the number of data read requests, and the number of transmission frames, and calculates the storage position of the data in the memory.

In still another embodiment of the invention, the data read section includes: a register for storing the old and new channel start positions and renewing the old and new channel start positions in response to the channel multiplexing construction change signal; a first counter for counting the number of data read requests; a second counter for counting the number of transmission frames, the second counter being initialized on receipt of the channel multiplexing construction change signal; and an operator for calculating a storage position of data in the memory based on values of the register, the first counter, and the second counter.

In still another embodiment of the invention, the transmission frame includes, at a stage of the intermediate frame, a data segment for which the inter-frame interleaving has been performed and a data segment for which the inter-frame interleaving has not been performed, the data write section writes the data segment for which the inter-frame interleaving has been performed and the data segment for which the inter-frame interleaving has not been performed into different storage positions of the memory, and the data read section releases the inter-frame interleaving and the inner-segment interleaving simultaneously for the data segment for which the inter-frame interleaving has been performed when reading data from the memory and outputs the data, while the data read section releases the inner-segment interleaving for the data segment for which the inter-frame interleaving has not been performed when reading data from the memory and outputs the data.

In still another embodiment of the invention, the data segments are transmitted via sub-carriers included in at least one symbol constituting orthogonal frequency division multiplex, and the transmission frame includes a plurality of symbols constituting orthogonal frequency division multiplex.

In still another embodiment of the invention, the memory is a DRAM having a fast page mode, and the data write section writes at least two consecutive data in the transmission frame at continuous addresses in the DRAM in the fast page mode.

In still another embodiment of the invention, the data segment is transmitted via sub-carriers included in at least one symbol constituting orthogonal frequency division multiplex, a guard interval is added to the symbol constituting orthogonal frequency division multiplex, the transmission frame includes a plurality of symbols constituting orthogonal frequency division multiplex, an orthogonal frequency division multiplex demodulator is connected upstream of the deinterleaving device, and refresh operation of the DRAM is performed during the guard interval.

Thus, the invention described herein makes possible the advantages of (1) providing a less expensive deinterleaving device which does not require a frequency interleave memory nor an output buffer, and (2) providing a deinterleaving device capable of realizing a high output data rate using an inexpensive DRAM as an external memory.

These and other advantages of the present invention will become apparent to those skilled in the art upon reading and understanding the following detailed description with reference to the accompanying figures.

BRIEF DESCRIPTION OF THE DRAWINGS

FIG. 3 illustrates details of an intermediate frame shown in FIG. 2;

DESCRIPTION OF THE PREFERRED EMBODIMENTS

Hereinbelow, the present invention will be described by way of examples with reference to the relevant drawings.

EXAMPLE 1

Figure 1A:
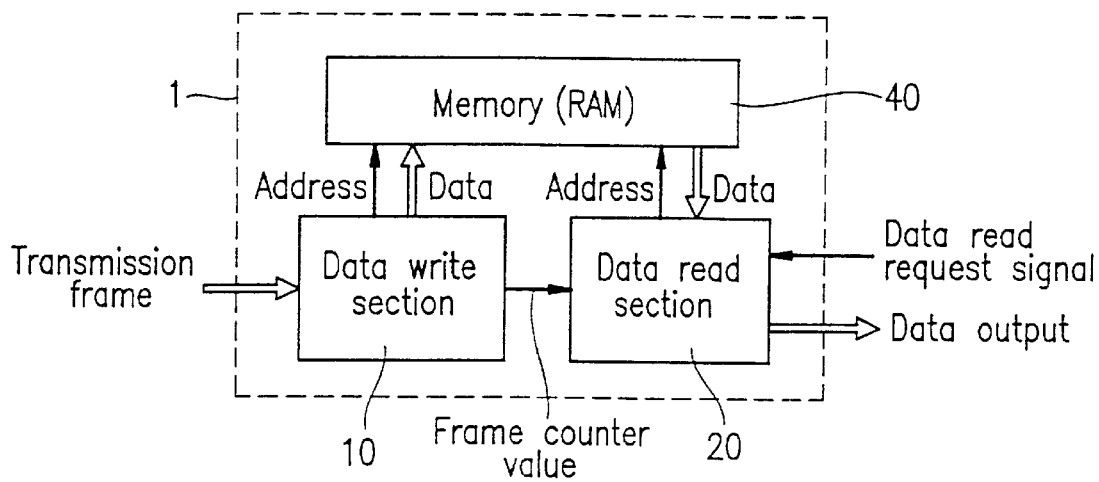
FIG. 1A is a block diagram illustrating a deinterleaving device of Example 1 according to the present invention.
Figure 1B:
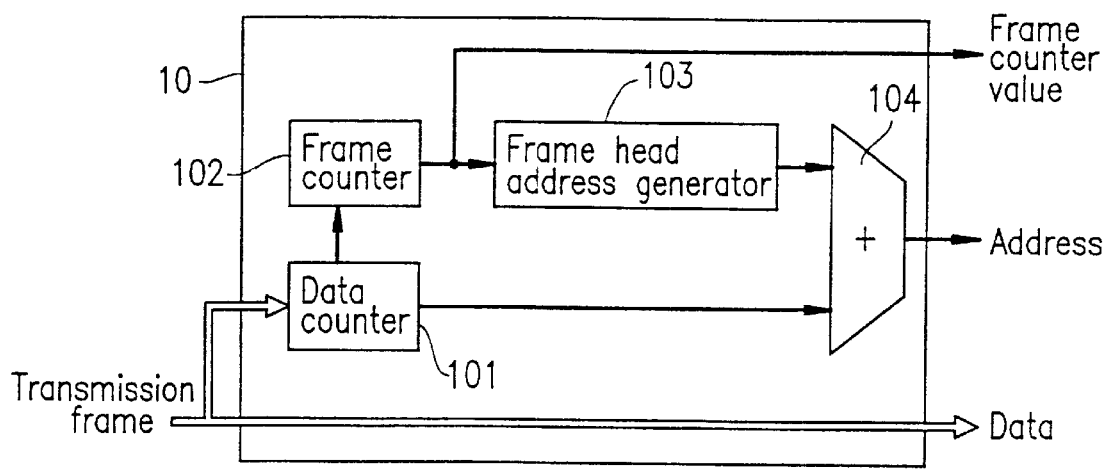
FIG. 1B is a block diagram of a data write section of the deinterleaving device of Example 1.
Figure 1C:
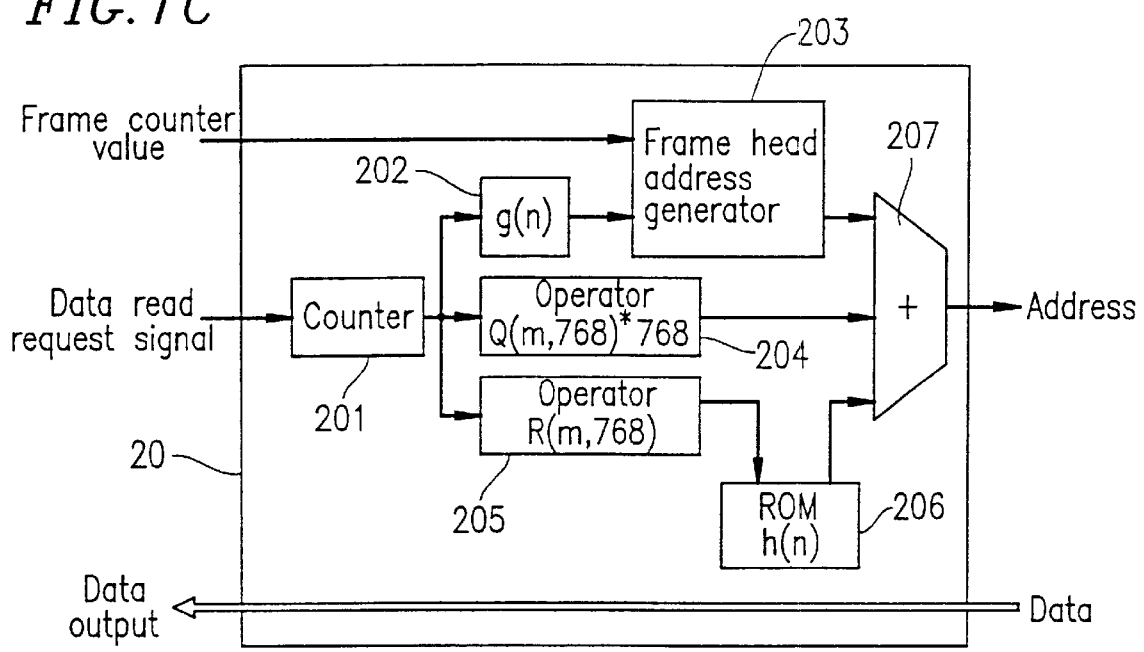
FIG. 1C is a block diagram of a data read section of the deinterleaving device of Example 1.

FIG. 1A is a block diagram illustrating a deinterleaving device 1 of Example 1 according to the present invention. FIG. 1B is a block diagram illustrating an internal construction of a data write section 10 of the deinterleaving device 1 of FIG. 1A, and FIG. 1C is a block diagram illustrating an internal construction of a data read section 20 of the deinterleaving device 1 of FIG. 1A.

Referring to FIG. 1A, the deinterleaving device 1 includes the data write section 10, the data read section 20, and a memory 40. The memory 40 is a 1M-word dual-port SRAM having a write port and a read port.

Figure 2:
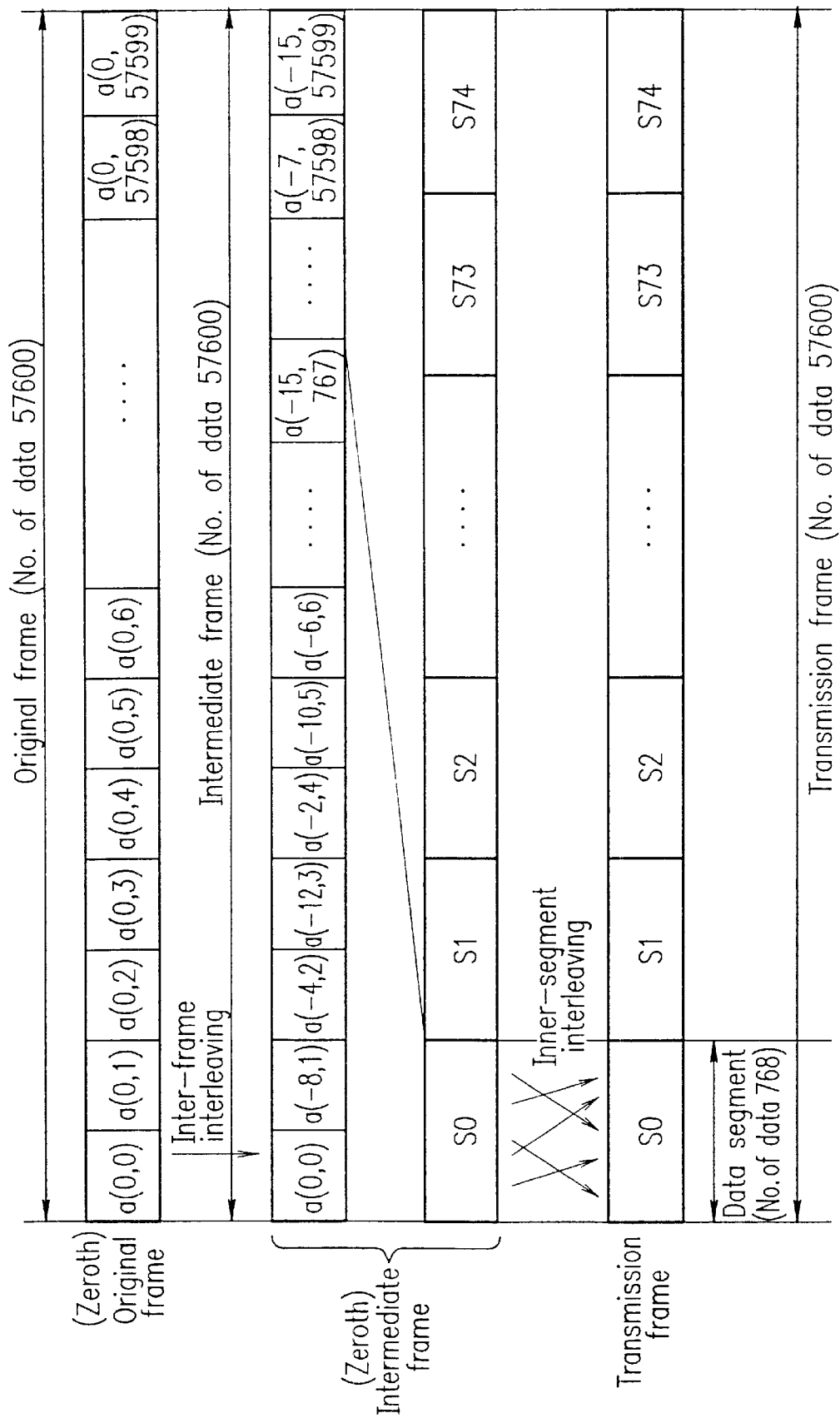
FIG. 2 illustrates an example of frame to be processed by the deinterleaving device of Example 1.

FIG. 2 illustrates an exemplified transmission frame to be processed by the device shown in FIG. 1A. Referring to FIG. 2, a transmission frame having 57,600 data is divided into 75 data segments each composed of 768 data. One data is assumed to be expressed by four bits, for example. It is also assumed that one data segment is transmitted via an OFDM symbol composed of 384 QPSK-modulated sub-carriers and is input to the deinterleaving device of this example after demodulation.

As is shown in FIG. 2, the transmission frame (after demodulation) has been subjected to inter-frame interleaving (time interleaving) and inner-segment interleaving (frequency interleaving), which correspond to interleave on a time axis and interleave on a frequency axis, respectively.

In the inter-frame interleaving, data are exchanged between a plurality of frames. For example, in the zeroth intermediate frame, a(−8,1) represents the first data in the minus eighth original frame.

In the inner-segment interleaving, the order of data in each segment of an intermediate frame is changed.

The rule of the above interleaves will be described in detail.

Assuming that the k-th data in the L-th original frame is represented by a(L,k), and the k-th data in the L-th intermediate frame after inter-frame interleaving is represented by b(L,k), the two data have the relationship of expression (1) below.

$$b(L,k)=a(L-g\{R(k,16)\},k) \quad (1)$$

wherein R(m,r) denotes a remainder obtained when an integer m is divided by a natural number r, and g(n) denotes a function defined by expression (2) below. The function g(n) represents the rule of inter-frame interleaving.

$$g(0)=0;\ g(1)=8;\ g(2)=4;$$
$$g(3)=12;\ g(4)=2;\ g(5)=10;$$
$$g(6)=6;\ g(7)=14;\ g(8)=1;$$
$$g(9)=9;\ g(10)=5;\ g(11)=13;$$
$$g(12)=3;\ g(13)=11;\ g(14)=7;$$
$$g(15)=15; \quad (2)$$

Further, assuming that the k-th data in the L-th transmission frame after inner-segment interleaving is represented by c(L,k), the relationship of expression (3) below is established between c(L,k) and b(L,k).

$$c(L,k)=b(L,768\cdot Q(k,768)+f\{R(k,768)\}) \quad (3)$$

wherein Q(m,r) denotes a quotient obtained when an integer m is divided by a natural number r, and f(n) denotes a one-to-one function having a defined range and value range of integers of 0 to 767 inclusive. The function f(n) represents the rule of inner-segment interleaving. Detailed description on this function is not necessary in the understanding of the operation of the deinterleaving device.

FIG. 2 also illustrates detailed data in the zeroth original frame and the zeroth intermediate frame. FIG. 3 illustrates detailed data of the zeroth to fifteenth intermediate frames, where data belonging to the zeroth original frame are hatched. The above transmission frame resembles a transmission frame in a method called European DAB Mode 2.

Figure 4:
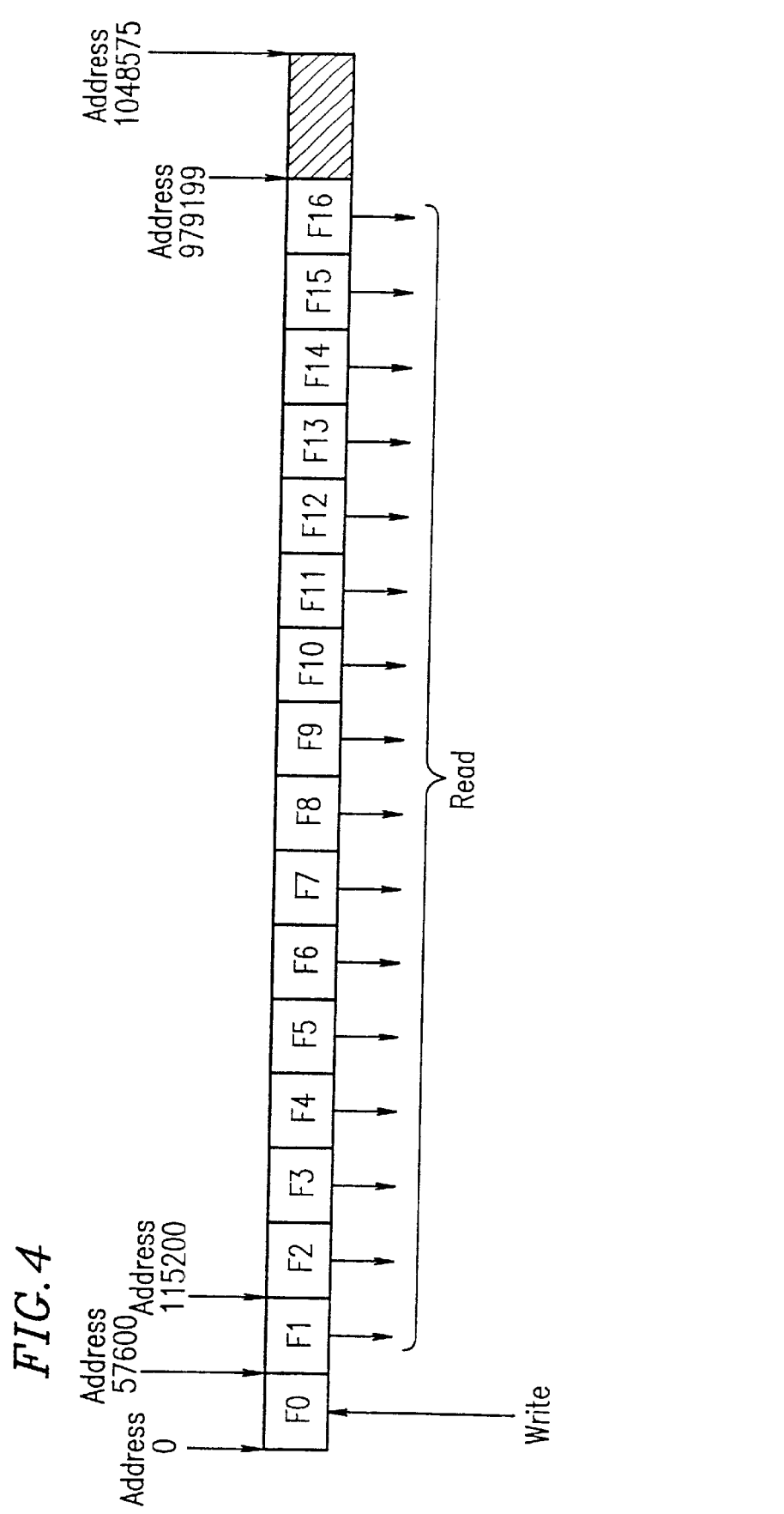
FIG. 4 illustrates a memory map of a memory of the deinterleaving device of Example 1.

When a transmission frame is input to the deinterleaving device 1, the data write section 10 generates addresses for the write port of the memory 40, and sequentially writes data in the transmission frame into continuous addresses in the memory 40. FIG. 4 illustrates a memory map of the memory 40, where 17 compartments (F0 to F16) for storing transmission frames are formed in the memory. Transmission frames are stored at a cycle of 17 frames in these compartments. In other words, once the zeroth to sixteenth frames are stored in compartments F0 to F16, the seventeenth frame is stored in compartment F0.

Referring to FIG. 1B, for realizing the above function, the data write section 10 includes a data counter 101, a frame counter 102, a frame head address generator 103, and an adder 104. The data counter 101 is a 57,600-scale counter counting the number of data in transmission frames. When the count value reaches 57,599, the data counter 101 increments the count of the frame counter 102 by one. The frame counter 102 is a 17-scale counter. The frame head address generator 103 generates a value obtained by multiplying the value of the frame counter 102 by 57,600. The adder 104 sums the value of the data counter 101 and the output value of the frame head address generator 103. Using the output of the adder 104 as an address, the transmission frames are cyclically stored in the compartments of the RAM.

Referring to FIG. 4, when a transmission frame is being written in the compartment F0, data is read from the compartments F1 to F16. At this time, the latest frame is stored in the compartment F16 and the oldest frame is stored in the compartment F1. When a next transmission frame is written in the compartment F1, data is read from the compartments F2 to F16 and F0. At this time, the latest frame is stored in the compartment F0 and the oldest frame is stored in the compartment F2. In this way, the compartment from which data is read is cycled for each frame, so that the read and write operations will not collide with each other.

Referring to FIG. 1C, for realizing the above function, the data read section 20 includes a counter 201, a first operator 202, a frame head address generator 203, a second operator 204, a third operator 205, a ROM 206, and an adder 207. The counter 201 counts the number of data read requests m in response to a data read request signal received externally. The first operator 202 receives four less significant bits (n) of the counter 201 and outputs a function value g(n). The first operator 202 is only required to invert the bits of the input value as a nature of the function.

Herein, by calculating backward from the definitions of the k-th data in the L-th original frame a(L,k), the k-th data in the L-th intermediate frame b(L,k) represented by expression (1), and the k-th data in the L-th transmission frame c(L,k) represented by expression (3), as described above, the relationship of expression (4) below is established.

$$a(L,p)=c(L+g\{R(p,16)\},\ 768\cdot Q(p,768)+h\{R(p,768)\}) \quad (4)$$

wherein the function h(n) is an inverse function of f(n).

Assuming that the L-th transmission frame is currently being written in the compartment Fc (i.e., the value of the frame counter 102 is Fc), it is possible to read the (L-16)th original frame from a compartment other than the compartment Fc. From the above-described data write method and expression (4), it is found that the m-th data in the (L-16)th original frame is stored in a compartment at a position calculated from expression (5) below and that the relative position in the compartment is calculated from expression (6) below. The resultant data is an output for the m-th read request.

$$R((Fc-16)+g\{R(m,16)\},17) \quad (5)$$

$$768\cdot Q(m,768)+h\{R(m,768)\}) \quad (6)$$

The frame head address generator 203 calculates expression (5) from the value Fc of the frame counter 102 and the output of the first operator 202, g{R(m,16)}, and outputs a value obtained by multiplying the value of expression (5) by 57600. The second operator 204 calculates the first term of expression (6). The third operator 205 calculates an argument R(m,768) of the function h of the second term of expression (6). The ROM 206 receives the value calculated by the third operator 205 as an address input, and outputs the function value h{R(m,768)}. The adder 207 sums the output values of the frame head address generator 203, the second operator 204, and the ROM 206. Using the output of the adder 207 as an address, the m-th data in the (L-16)th original frame is output in response to the m-th read request.

As described above, in the deinterleaving device of this example, since time interleave and frequency interleave are released simultaneously during reading data from the memory, a memory for frequency interleave is no more required. Moreover, since data is output in response to a data read request signal, an output buffer is no more required. With these effects, the capacity of the memory (SRAM) can be made small compared with the conventional examples, and thus a less expensive device is realized.

In this example, the data write section and the data read section are constructed of respective exclusive circuits. The present invention is not restricted to this construction. For example, it is possible, in principle, to use a general purpose processor to realize substantially the same function as that described above. A dual-port SRAM is used as the memory in this example. Alternatively, a one-port SRAM or DRAM, for example, may be used as the memory by additionally providing a control circuit which enables read and write operations by time division. Although, OFDM is employed as the transmission method for transmission frames in this example, other transmission methods may be used. Also, the structure of the transmission frame is not restricted to that described in this example.

In this example, deinterleaving is performed during reading of data. Alternatively, deinterleaving may be performed during writing of data, and data may be written so that the data can be read from continuous addresses during reading. By this construction, also, substantially the same effect as that described above can be obtained.

Figure 5:
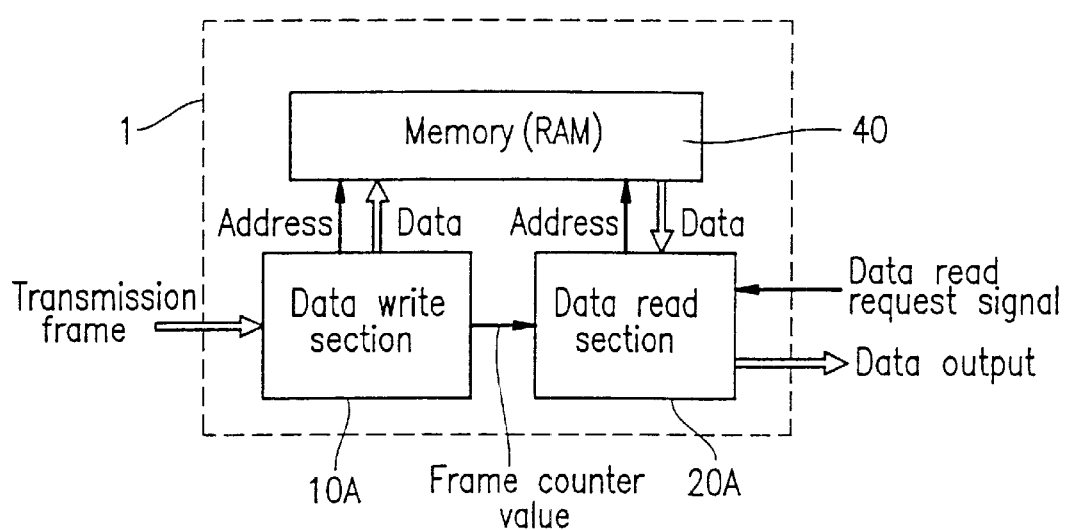
FIG. 5 is a block diagram illustrating another deinterleaving device of Example 1 according to the present invention.

For example, FIG. 5 illustrates an alternative deinterleaving device of this example which performs deinterleaving during writing. Upon receipt of a transmission frame, a data write section 10A generates an address for each data in the transmission frame in the memory 40 corresponding to a relative position calculated from expression (5A) below in a compartment at a position of the memory 40 calculated from expression (6A) below, and stores the k-th data in the L-th transmission frame at the generated address. In this way, respective data in an original frame are arranged in the memory 40. A data read section 20A can merely read the respective data in the original frame sequentially from the compartment Fc of the memory 40.

$$R((Fc+16)-g\{R(k,16)\},17) \quad (5A)$$

$$768\cdot Q(k,768)+h\{R(k,768)\} \quad (6A)$$

EXAMPLE 2

Figure 6:
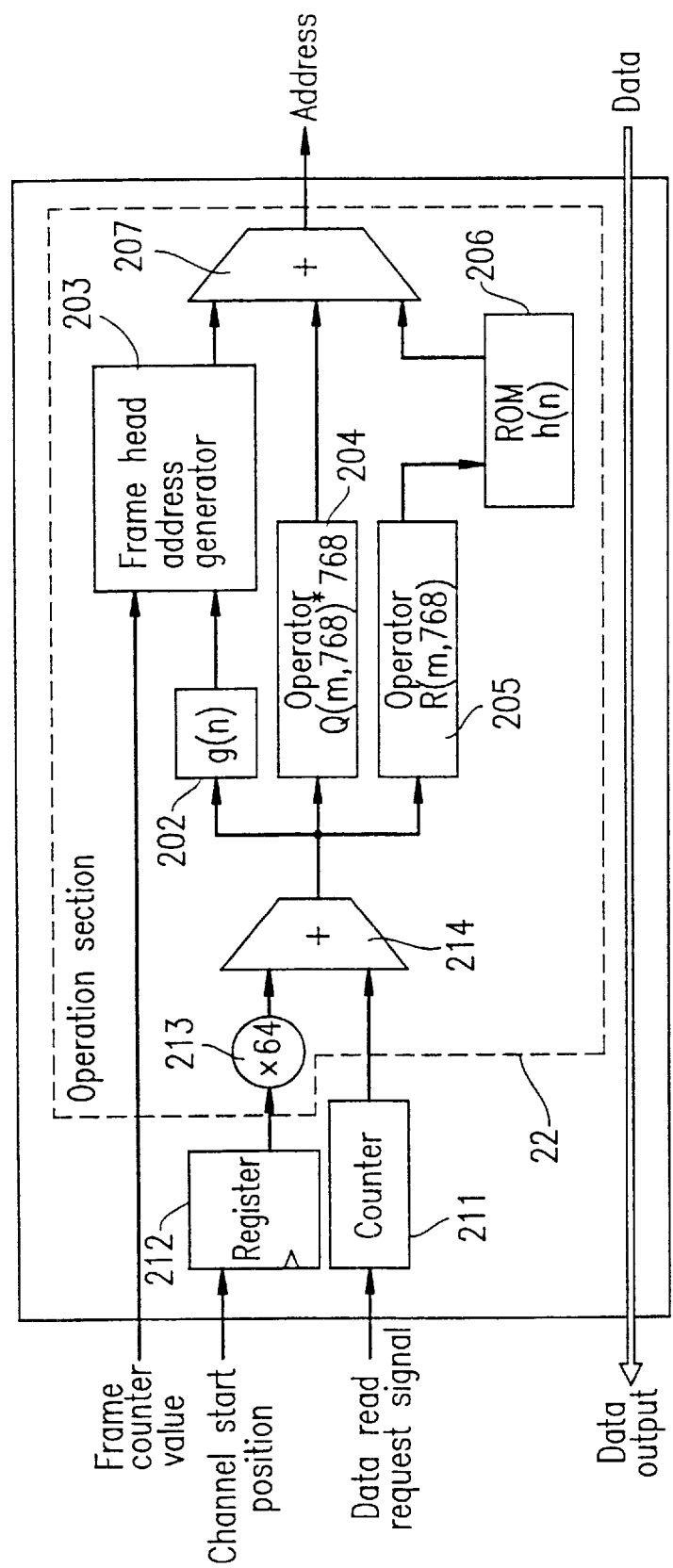
FIG. 6 is a block diagram of a data write section of a deinterleaving device of Example 2 according to the present invention.

FIG. 6 is a block diagram of a data read section 20B of a deinterleaving device of Example 2 according to the present invention. The construction of the deinterleaving device of this example is the same as that of the deinterleaving device of Example 1, except that the data read section 20 in Example 1 is replaced with the data read section 20B. The description of the data write section 10 and the memory 40 is therefore omitted here.

Figure 7:
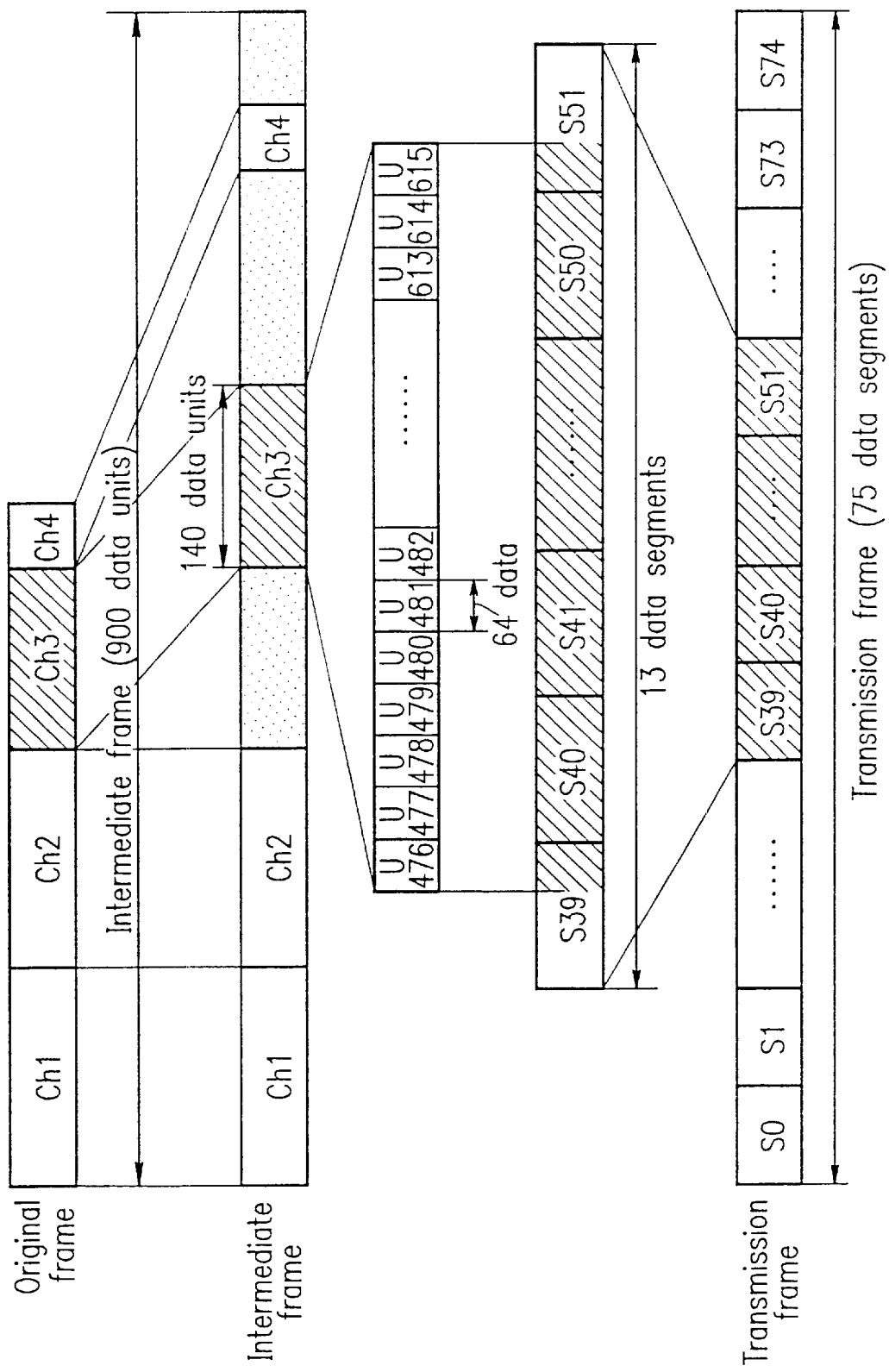
FIG. 7 illustrates an example of frame to be processed by the deinterleaving device of Example 2.

FIG. 7 illustrates an exemplified transmission frame to be processed by the deinterleaving device of this example.

Referring to FIG. 7, an intermediate frame having 57,600 data is divided into 900 data units each composed of 64 data. The intermediate frame has four multiplexed channels, and each channel occupies consecutive data units. For example, the third channel occupies 140 data units from the 476th to the 615th data units. Inter-frame interleaving has been performed under the same rule as that described in Example 1 for each channel. As in Example 1, the intermediate frame is divided into 75 data segments. Inner-segment interleaving is performed for each data segment to form the transmission frame. Data in the third channel is therefore included in 13 data segments from S39 to S51 as shown in FIG. 7.

The transmission frame with the above structure is stored in the memory 40 by the data write section 10 shown in FIG. 1 in the procedure as described in Example 1.

Thereafter, the data read section 20B in this example releases the interleaves provided in the transmission frame and the channel. Referring to FIG. 6, the data re ad section 20B includes a counter 211, a register 212, and an operation portion 22. Components of t he operation portion 22 which are the same as those in Example 1 are denoted by the same reference numerals and the description thereof is omitted here.

In the data read section 20B, upon receipt of a data read request signal, the counter 211 counts the number of read requests m. The number m circulates in the range of 0 to 8959 since the counter 211 counts data in the third channel cyclically.

The register 212 stores the channel start position designated externally. For example, in the case where the third channel of the above transmission frame is selected, the head data unit Number Un (=476) is stored as the channel start position.

A shifter 213 shifts the output value Un of the register 212 by 6 bits leftward to obtain a value 64 times the value Un (i.e., 64Un). A second adder 214 sums the output values of the counter 211 and the shifter 213 (64Un+m). The resultant value is then input to the operators 202, 204, and 205, where the procedures described in Example 1 are performed. As a result, data in the third channel is output from the deinterleaving device (after deinterleaving).

As described above, the deinterleaving device of this example includes a mechanism of selecting one of multiplexed channels in a transmission frame and deinterleaving data in the channel. For other channels which have not been selected, the circuit operation of the data read section 20B is inactivated to prevent data in such non-selected channels from being read and deinterleaved. This enables a significant reduction in power consumption compared with the deinterleaving device of Example 1.

In this example, the data read section is constructed of an exclusive circuit. The present invention is not restricted to this construction. Also, the memory and the transmission method for transmission frames are not restricted to those in this example.

EXAMPLE 3

Figure 8:
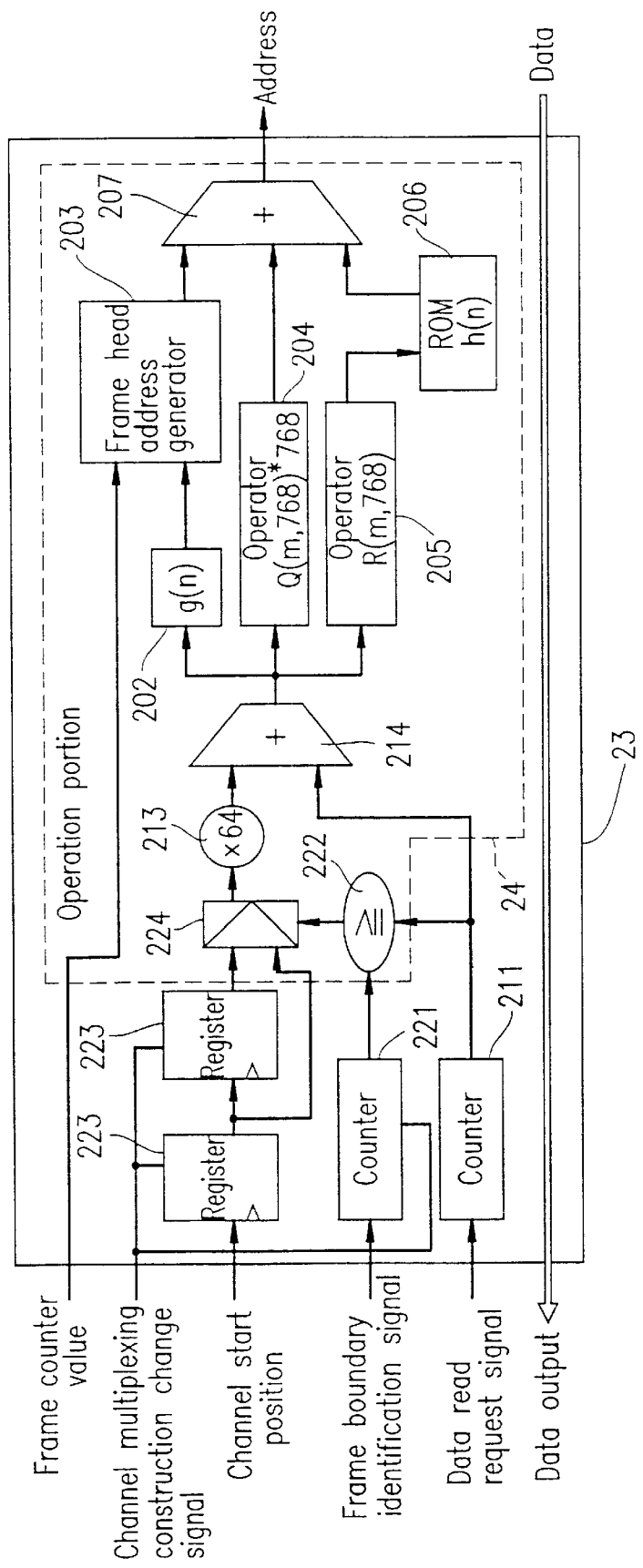
FIG. 8 is a block diagram of a data write section of a deinterleaving device of Example 3 according to the present invention.

FIG. 8 is a block diagram of a data read section 20C of a deinterleaving device of Example 3 according to the present invention. The construction of the deinterleaving device of this example is the same as that of the deinterleaving device of Example 1, except that the data read section 20 in Example 1 is replaced with the data read section 20C. The description of the data write section 10 and the memory 40 is therefore omitted here.

Figure 9:
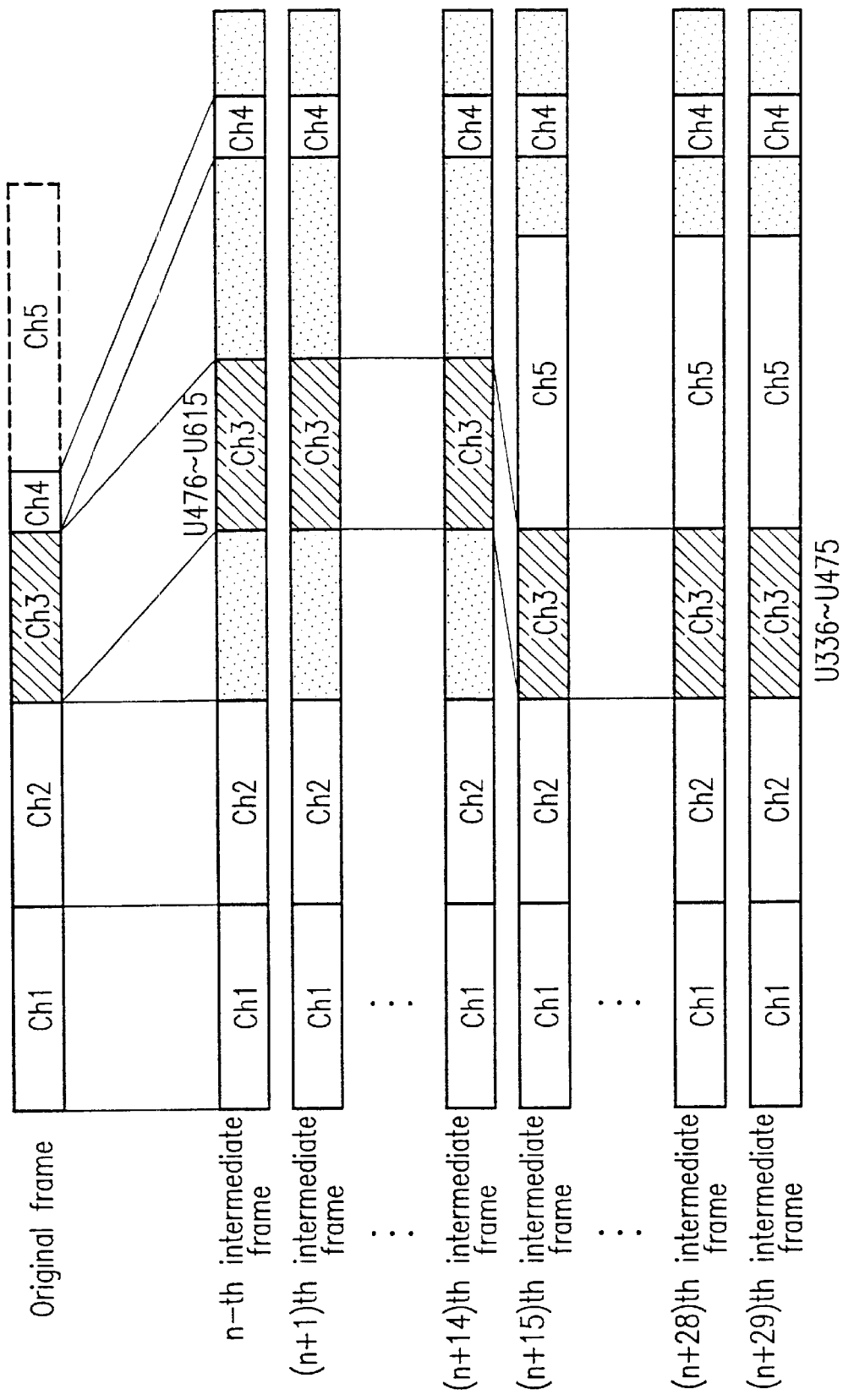
FIG. 9 illustrates an example of frame to be processed by the deinterleaving device of Example 3.

FIG. 9 illustrates an exemplified frame to be processed by the deinterleaving device of this example. Referring to FIG. 9, the process of generating an intermediate frame from an original frame via inter-frame interleaving is the same as that shown in FIG. 7. In this example, however, the construction of channel multiplexing changes from a midway frame (the (n+15)th intermediate frame in FIG. 9). For example, in the illustrated example, the third channel, which originally occupies the 476th to 615th data units, changes to occupy the 336th to 475th data units after the change of multiplexing construction. Also, after the change of multiplexing construction, a new channel (the fifth channel) is added to the intermediate frame. The procedure of generating a transmission frame from the intermediate frame via inner-segment interleaving is the same as that described in Example 2. The description thereof is therefore omitted here.

Inter-frame interleaving as shown in FIG. 3 has been performed in the respective channels. In the case where the multiplexing construction is changed somewhere in the 16 frames to be deinterleaved, two different channel start positions are temporarily generated for one channel. It is therefore required to calculate addresses of data in the memory 40 using the two different channel start positions. More specifically, for data which has been subjected to inter-frame interleaving before the change of multiplexing construction, the address of the data in the memory 40 must be calculated based on the old channel start position. For data which has been subjected to inter-frame interleaving after the change of multiplexing construction, the address of the data in the memory 40 must be calculated based on the new channel start position.

Referring to FIG. 8, in order to deinterleave data in each channel, the data read section 20C in this example includes a first counter 211, a second counter 221, two registers 223, and an operation portion 24. Components of the operation portion 24 which are the same as those in Example 1 are denoted by the same reference numerals and the description thereof is omitted here.

On receipt of a data read request signal, the first counter 211 counts the number of read requests m, as in the counter 211 shown in FIG. 6. The counter value m is associated with the m-th data in the selected channel.

On receipt of a channel multiplexing construction change signal, the second counter 221 initializes the count value to 15. The second counter 221 decrements the counter value for each transmission frame, and stops counting when the value reaches zero. In order to allow the second counter 221 to decrement the value for each transmission frame, the second counter 221 may receive an external signal which pulses at each boundary between transmission frames. The time period from the initialization and operation start until the operation stop of the second counter 221 corresponds to the time period from the generation of two different channel start positions until the settling to one channel start position.

The two registers 223 constitute shift registers which store the new and old channel start positions. When a channel multiplexing construction change signal is input, these shift registers store the new channel start position and shift the old channel start position to the next stage, resulting in renewing both the new and old channel start positions.

The value m of the first counter 211 and a value C of the second counter 221 are input to a comparator 222, and the output of the comparator 222 controls a selector 224. The selector 224 selects the new channel start position if expression (7) below is satisfied, or selects the old channel start position if not satisfied, and supplies the result to a shifter 213. The subsequent procedure of the data read section 20C is the same as that in Example 2.

$$C \leq g\{R(m,16)\} \tag{7}$$

The second counter value C obtained immediately after the receipt of a channel multiplexing construction change signal is 15. As is apparent from expression (4), when the value m is a value with which the right side of expression (7) becomes 15, the m-th data belongs to the latest frame. Therefore, the new channel start position is adopted for the m-th data, while the old channel start position is adopted for data belonging to the other non-latest 15 frames.

When the procedure moves to the next frame, the value C becomes 14. In this case, the new channel start position is adopted in the case where the right side of expression (7) is 14 or 15, i.e., for data belonging to the latest frame or the second latest frame. The old channel start position is adopted for data belonging to the remaining 14 frames. In this way, the number of data for which the new channel start position is adopted increases as the procedure moves to the next frame. When the second counter value C reaches zero, the new channel start position is adopted for all data.

With the above construction, the deinterleaving device of this example is capable of continuing deinterleaving even when the channel multiplexing construction changes midway through the process. Thus, if a receiver is provided with the deinterleaving device of this example, the transmitter side can perform dynamic channel multiplexing.

Although the data read section is constructed of an exclusive circuit in this example, the present invention is not restricted to this construction. Also, the memory and the transmission method for transmission frames are not restricted to those in this example.

EXAMPLE 4

Figure 10:
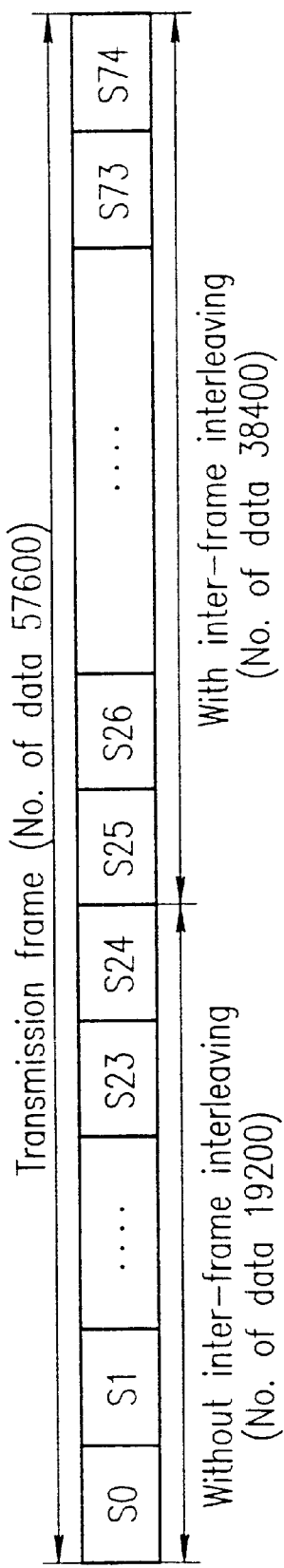
FIG. 10 illustrates an example of a transmission frame to be processed by a deinterleaving device of Example 4 according to the present invention.

FIG. 10 illustrates an exemplified transmission frame to be processed by a deinterleaving device of Example 4 according to the present invention. Referring to FIG. 10, the number of data in the transmission frame, the number of data segments in the transmission frame, and the method of inner-segment interleaving are the same as those in Example 1. In the transmission frame shown in FIG. 10, however, inter-frame interleaving is not performed for data belonging to the zeroth to 24th data segments of the transmission frame, while inter-frame interleaving is performed for data belonging to the 25th to 74th data segments as in Example 1.

In reality, in European DAB transmission frames, time interleaving is not performed for some OFDM symbols known as fast information channel, in order to avoid a delay due to time interleaving to realize prompt data transmission. In this case, more intensified error correction is performed by reducing the coding rate because data without time interleaving is vulnerable to time-axis burst error.

Figure 11:
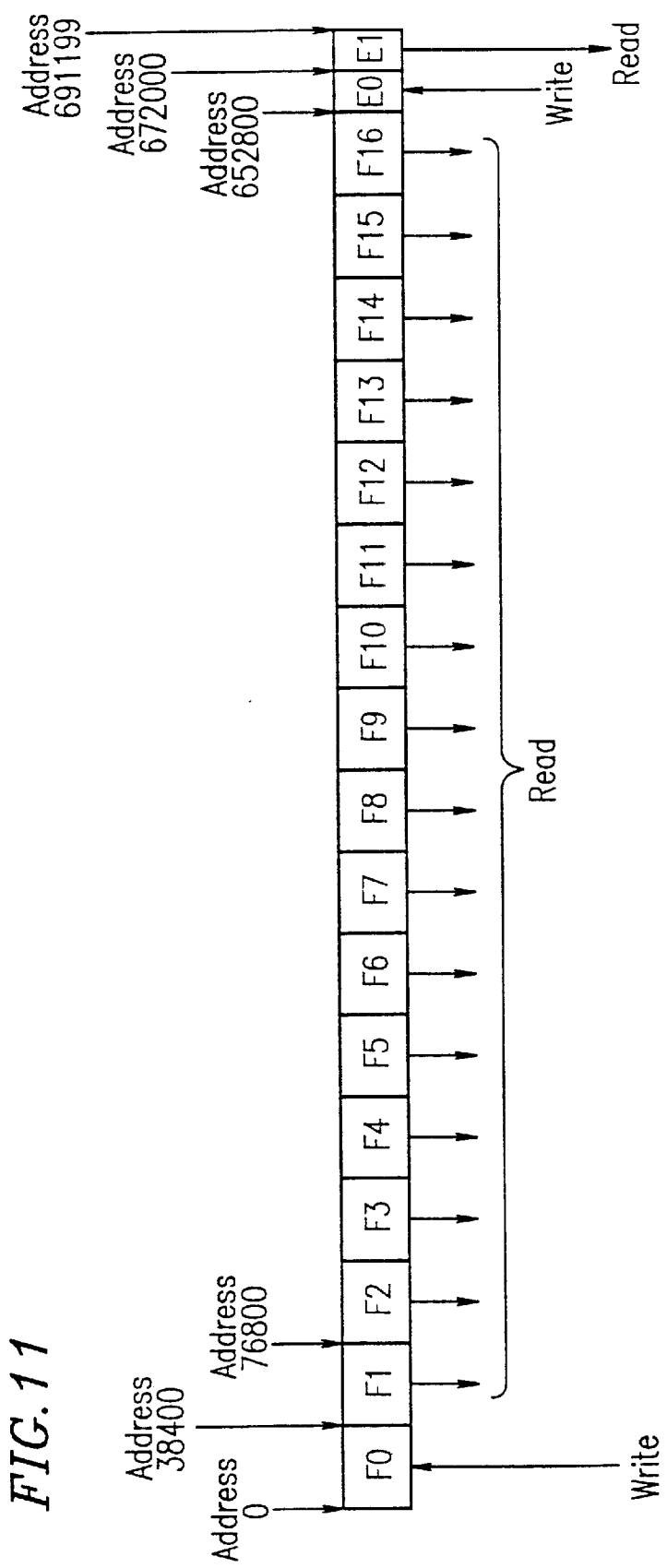
FIG. 11 illustrates a memory map of a RAM of the deinterleaving device of Example 4.

FIG. 11 illustrates a memory map of the memory 40 in Example 4. Unlike Example 1, data segments which have not been subjected to inter-frame interleaving are stored in compartments E0 and E1 while data segments which have been subjected to inter-frame interleaving are stored in compartments F0 to F16. The compartments F0 to F16 correspond to the respective frames, and a total of 50 data segments from the 25th to 74th data segments are stored in respective compartments. Thus, addresses 0 to 652799 are allocated for the compartments F0 to F16. For the compartments E0 and E1 in which data in the first 25 data segments in the respective transmission frame are alternately stored, addresses 652800 to 671999 and 672000 to 691199 are allocated.

Although FIG. 11 is shown so that data is written in the compartment E0 and data is read from the compartment E1 the read and write compartments are switched with each other every frame so as to avoid collision between the write and read operations.

If inter-frame interleaving has not been performed, it is not necessary to store data in the past 16 frames as in the case where inter-frame interleaving has been performed. By separating the storage positions for data based on the existence of inter-frame interleaving as described above, the memory capacity can be saved.

For example, while a memory capacity of 979,200 words is required in Example 1, a memory capacity of only 691,200 words is required in Example 4. This reduction in memory capacity will contribute to a reduction in production cost of an LSI in the future when the LSI process technology advances to allow a large-capacity memory such as an inter-frame interleaving memory to be mounted in a signal processing LSI.

Figure 12:
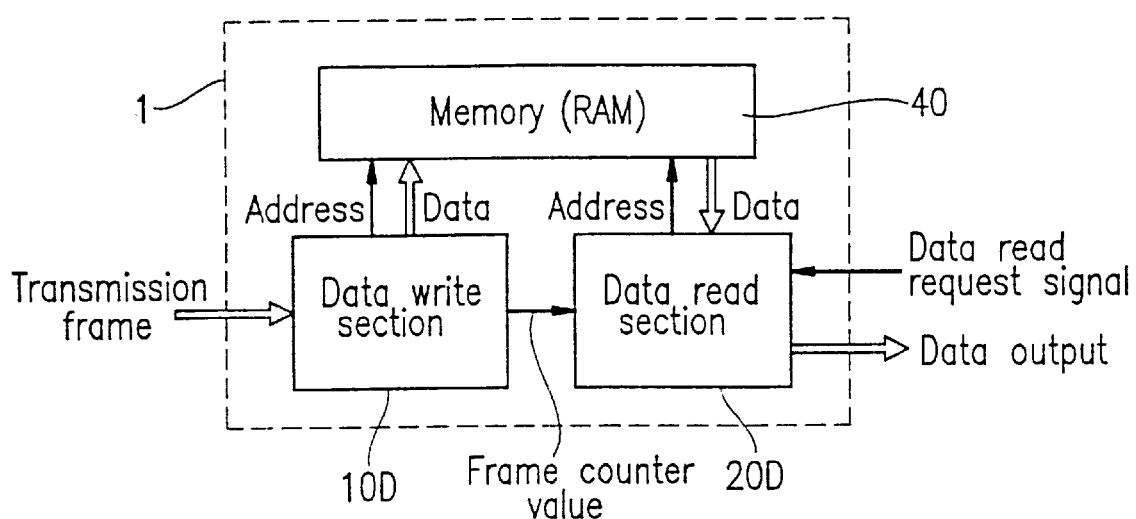
FIG. 12 is a block diagram illustrating the deinterleaving device of Example 4.

FIG. 12 is a block diagram of the deinterleaving device of Example 4. Referring to FIG. 12, as in the data write section 10 shown in FIG. 1, upon receipt of transmission frames, a data read section 10D generates addresses for the write port of the memory 40, and sequentially writes data belonging to the 25th to 74th data segments of the transmission frames into 0 to 652799 addresses in the memory 40. The data write section 10D also writes data belonging to the zeroth to 24th data segments of the transmission frames into 652800 to 671999 addresses and 672000 to 691199 addresses in the memory 40 alternately. The data read section 20D reads data from 0 to 652799 addresses in the memory 40 while releasing both the time and frequency interleaves as in the data read section 20 shown in FIG. 1. The data read section 20D also reads data from 652800 to 671999 addresses and 672000 to 691199 addresses in the memory 40 alternately.

The circuit construction and the memory are not restricted to those described in this example.

EXAMPLE 5

Figure 13:
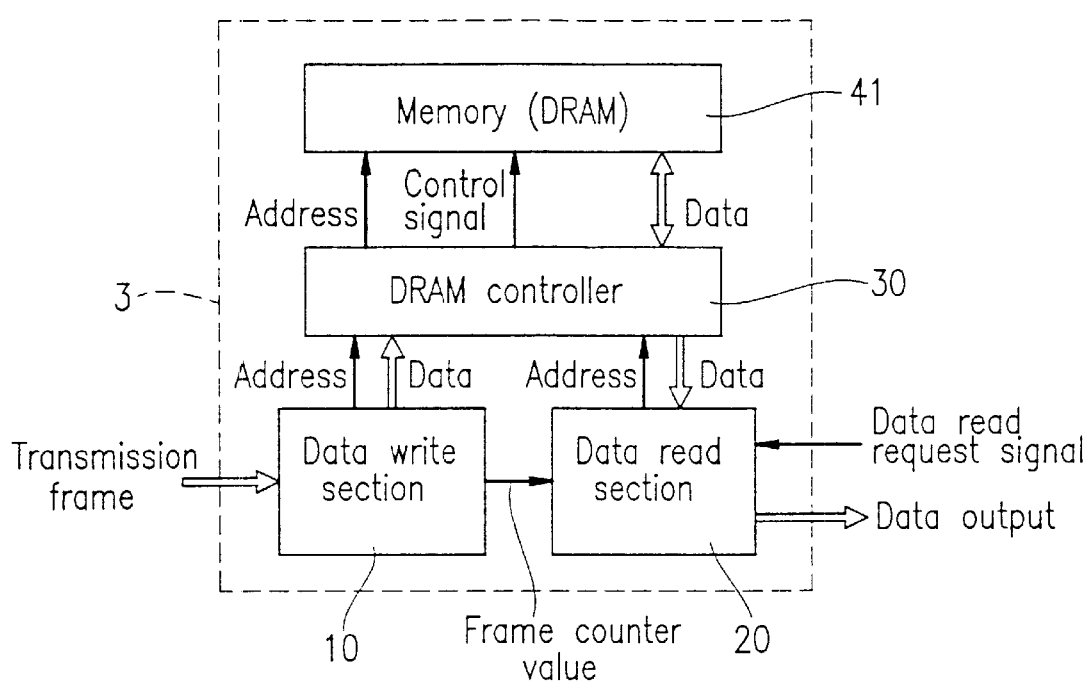
FIG. 13 is a block diagram illustrating a deinterleaving device of Example 5 according to the present invention.

FIG. 13 is a block diagram of a deinterleaving device 3 of Example 5 according to the present invention. The deinterleaving device 3 of Example 5 is the same as the deinterleaving device 1 shown in FIG. 1A, except that a memory (DRAM) 41 and a DRAM controller 30 are provided in place of the memory (SRAM) 40.

The DRAM controller 30 temporarily holds an address and data from the data write section 10 and an address from the data read section 20, and outputs these addresses and data to the DRAM 41 at a predetermined timing. The DRAM controller 30 also temporarily holds data output from the DRAM 41 and outputs the data to the data read section 20 at a predetermined timing. Hereinbelow, these predetermined timings will be described in detail.

Figure 14:
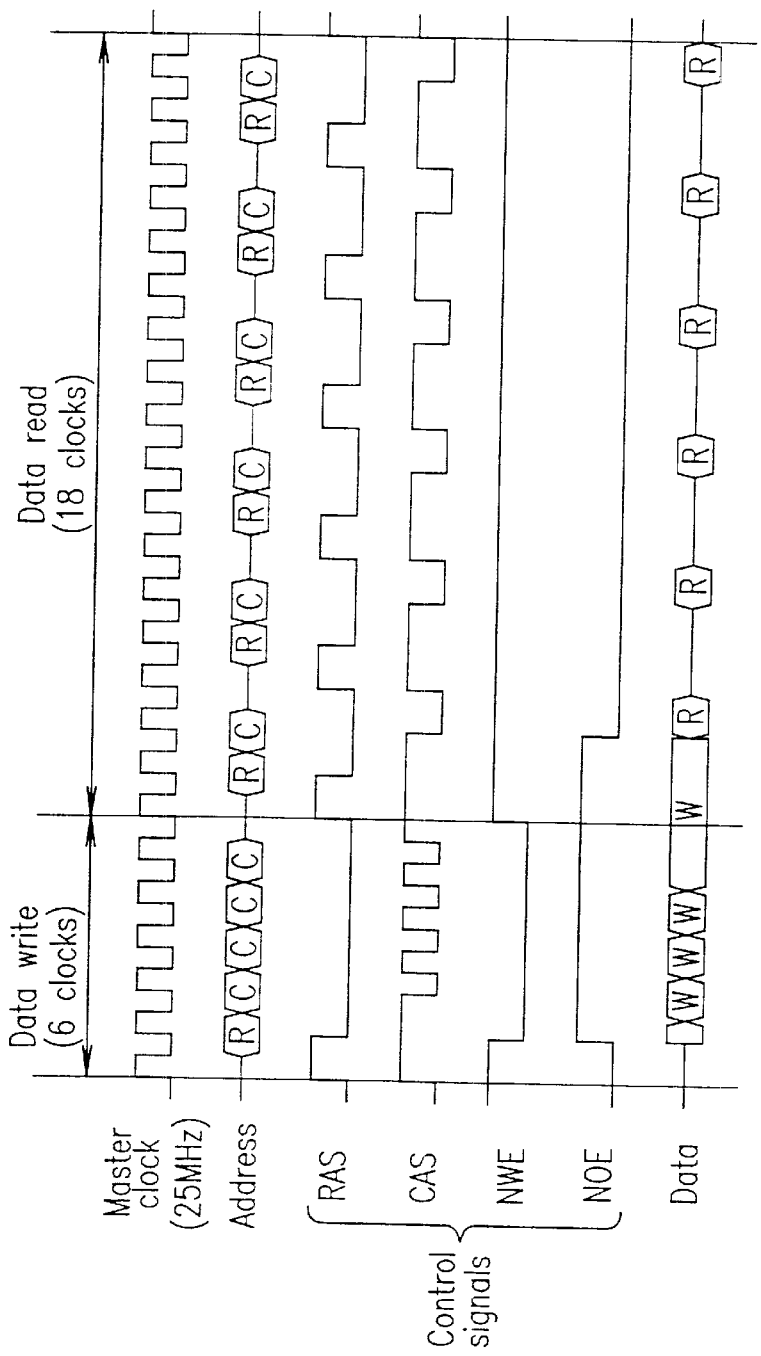
FIG. 14 is a timing chart of signals transmitted and received between a DRAM controller and a DRAM of the deinterleaving device of Example 5 shown in FIG. 13.

FIG. 14 is a timing chart of signals transmitted between the DRAM controller 30 and the DRAM 41. The DRAM controller 30 operates synchronously with a 25 MHz master clock and executes data write operation (six clocks) and data read operation (18 clocks) alternately in a cycle of 24 clocks. Since data is sequentially written into continuous addresses as described in Example 1, four data can be written during six clocks using a fast page mode. As for the read operation, since a random read is performed, a cycle time of 110 ns or more is required as discussed in the description of the related art. In Example 5, one data is read during three clocks (120 ns). The timing of various signals shown in FIG. 14 satisfies the timing restriction for a standard DRAM having an access time of 60 ns.

As described above, the deinterleaving device of this example executes four-data write and six-data read during 24 clocks. Accordingly, the average input data rate is 4.167 MHz and the average output data rate is 6.25 MHz. It is therefore sufficiently possible to obtain an output data rate of 1.536 MHz after error correction even for the European DAB standards mentioned in the description of the related art.

As described above, the deinterleaving device of this example, in which data is written using the fast page mode, realizes a high input/output data rates while using a DRAM with a low unit cost per bit.

The circuit construction and the transmission method for transmission frames are not restricted to those described in this example.

EXAMPLE 6

Figure 15:
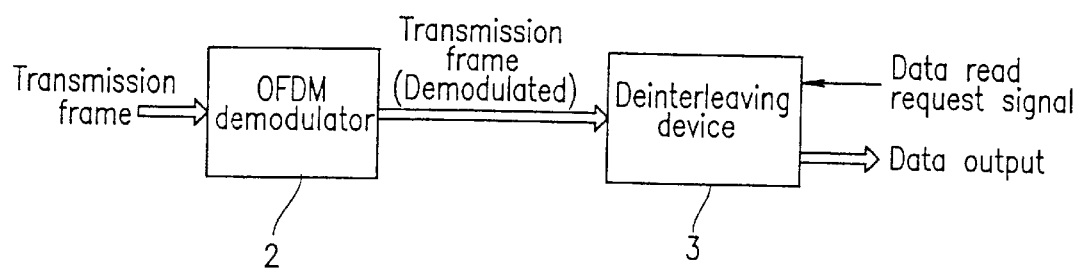
FIG. 15 is a block diagram illustrating a deinterleaving device of Example 6 according to the present invention.

FIG. 15 is a block diagram of a deinterleaving device 3 of Example 6 according to the present invention. The inner construction of the deinterleaving device 3 is the same as that shown in FIG. 13. Referring to FIG. 15, an OFDM demodulator 2 is provided upstream of the deinterleaving device 3. As in Example 1, the transmission frame to be processed is composed of 57,600 data and divided into 75 data segments. Each data segment is transmitted via an OFDM symbol composed of 384 QPSK-modulated subcarriers. The transmission frame is input to the deinterleaving device 3 after being demodulated by the OFDM demodulator 2.

Figure 16:
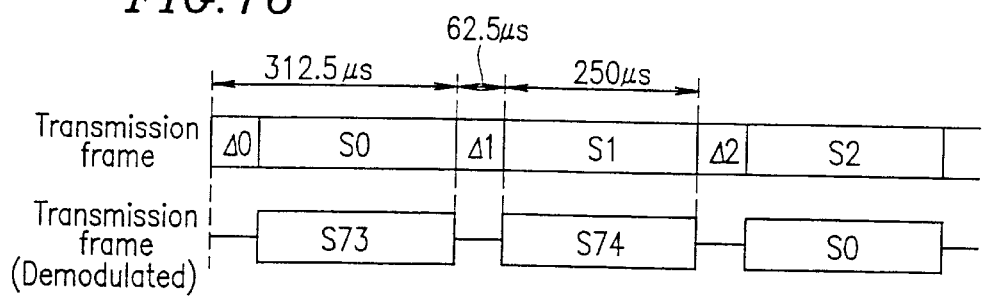
FIG. 16 illustrates part of a transmission frame to be processed by the deinterleaving device of Example 6.

FIG. 16 illustrates part of the transmission frame to be processed by the deinterleaving device of this example. Referring to FIG. 16, the length of each OFDM symbol is 250 µs, and a guard interval with a length of a quarter of the symbol length (62.5 µs) is added to each OFDM symbol. The guard interval is provided to prevent inter-symbol interference at multi-path signal receiving. In this example, the rear quarter portion of each symbol is copied at the head of the symbol as the guard interval. Since it takes time to retrieve and demodulate data, the OFDM demodulator 2 outputs the demodulation result delaying two symbols from the input. During the guard interval, the input transmission frame is discarded, the internal operation is stopped, and the demodulation result is not output.

The memory map of the memory (DRAM) 41 of the deinterleaving device of this example is the same as that shown in FIG. 4. In this case, it is after 16 frames, i.e., after 375 ms, at maximum that written data is read. After this time period, the data will be volatilized unless the DRAM is refreshed.

Figure 17:
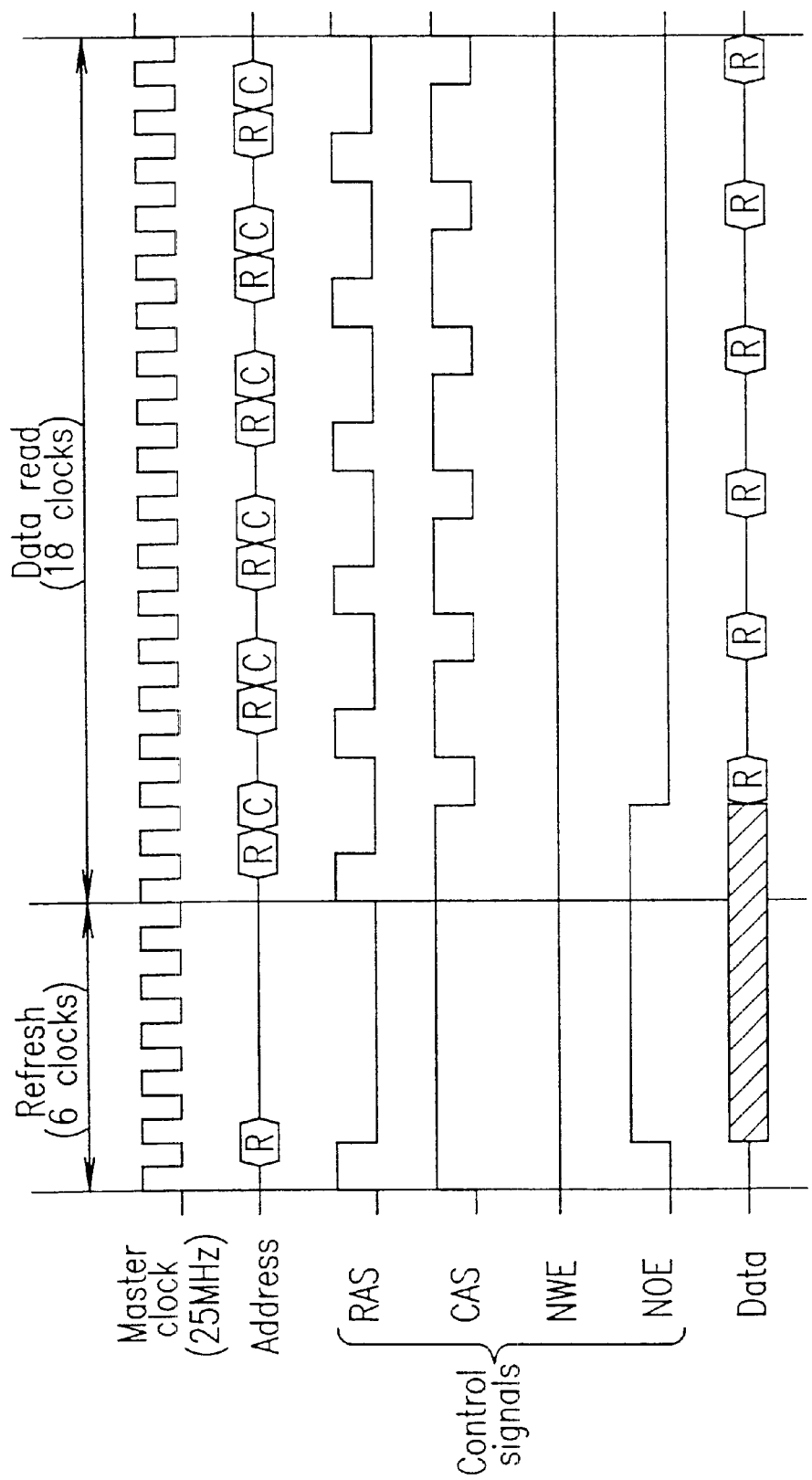
FIG. 17 is a timing chart of signals transmitted and received between a DRAM controller and a DRAM during a guard interval.

The interval releasing device of this example performs a refresh operation during the guard interval at a timing shown in FIG. 17. In other words, since no data is written during the guard interval, refresh operation is performed in place of write operation. This allows the refresh operation of the DRAM to be performed without reducing the input/output data rates nor changing the input/output timings.

In this example, since six clocks (240 ns) are used for one refresh operation, about 260 refresh operations (62.5 µs/240 ns) per symbol can be performed. The 1,024 refresh operations required for refreshing the entire DRAM 41 are completed within four symbols, i.e., within a time period of 1.25 ms. Since the time period of about 16 ms is enough for a current standard DRAM, the refresh operation may be performed at a lower speed than that in this example.

The circuit construction and the transmission method for transmission frames are not restricted to those described in this example.

Thus, the deinterleaving device according to the present invention does not require a memory for frequency interleave nor an output buffer. This allows for a less expensive device compared with the conventional devices.

A mechanism of selecting one of multiplexed channels in a transmission frame to deinterleave only data of the selected channel is provided. This serves to greatly reduce power consumption of the circuit.

Deinterleaving operations can be continuously performed even when the channel multiplexing construction changes midway. This allows for dynamic channel multiplexing on the transmitter side.

The storage positions of data are separated depending on the existence of inter-frame interleaving. This allows for saving of the capacity of the time interleave memory and thus reduction in LSI production cost.

Data is written using the fast page mode. This realizes high input/output data rates while using a DRAM with a low unit cost per bit.

Refresh operation is performed during the guard interval, allowing for effective DRAM refreshing.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A deinterleaving device for deinterleaving an input transmission frame and outputting the deinterleaved frame, the transmission frame being obtained by performing inter-frame interleaving for an original frame to form an intermediate frame and performing inner-segment interleaving for at least one data segment included in the intermediate frame, the deinterleaving device comprising:
    a memory;
    a data write section for receiving the transmission frame and writing the transmission frame into the memory; and
    a data read section for releasing the inter-frame interleaving and the inner-segment interleaving simultaneously when reading data from the memory and outputting the data.

2. A deinterleaving device according to claim 1, wherein the data write section receives data in a plurality of transmission frames and writes the data into the memory, and
    the data read section determines the order of the data in each of the transmission frames in a state where the inter-frame interleaving and the inner-segment interleaving are released by calculating backward a rearranging rule of the inner-segment interleaving and a rearranging rule of the inter-frame interleaving, reads the data from the memory in the determined order, and outputs the data.

3. A deinterleaving device according to claim 1, wherein the data write section includes:
    a data counter for counting the number of data in a transmission frame;
    a frame counter for counting the number of transmission frames;
    a first frame head address generator for generating an address in the memory at which head data of the transmission frame is to be stored based on a value of the frame counter; and
    a first adder for summing a value of the data counter and an output value of the first frame head address generator and outputting the result as an address in the memory.

4. A deinterleaving device according to claim 3, wherein the data read section includes:
- a counter for counting the number of data read requests;
- a second frame head address generator for generating an address in the memory at which the head data of the transmission frame is stored based on a value of the counter and a value of the frame counter of the data write section;
- a ROM for storing a rearranging rule of the inner-segment interleaving;
- a first operator for calculating a data segment to which desired output data belongs;
- a second operator for calculating a relative position of the desired output data in the data segment using the ROM; and
- a second adder for summing output values of the second frame head address generator, the first operator, and the second operator and outputting the result as an address in the memory.

5. A deinterleaving device according to claim 1, wherein the transmission frame includes, at a stage of the intermediate frame, a data segment for which the inter-frame interleaving has been performed and a data segment for which the inter-frame interleaving has not been performed,
- the data write section writes the data segment for which the inter-frame interleaving has been performed and the data segment for which the inter-frame interleaving has not been performed at different storage positions of the memory, and
- the data read section releases the inter-frame interleaving and the inner-segment interleaving simultaneously for the data segment for which the inter-frame interleaving has been performed when reading data from the memory and outputs the data, while the data read section releases the inner-segment interleaving for the data segment for which the inter-frame interleaving has not been performed when reading data from the memory and outputs the data.

6. A deinterleaving device according to claim 1, wherein the data segments are transmitted via sub-carriers included in at least one symbol constituting orthogonal frequency division multiplex, and
- the transmission frame includes a plurality of symbols constituting orthogonal frequency division multiplex.

7. A deinterleaving device according to claim 1, wherein the memory is a DRAM having a fast page mode, and
- the data write section writes at least two consecutive data in the transmission frame into continuous addresses in the DRAM in the fast page mode.

8. A deinterleaving device according to claim 7, wherein the data segment is transmitted via sub-carriers included in at least one symbol constituting orthogonal frequency division multiplex,
- a guard interval is added to the symbol constituting orthogonal frequency division multiplex,
- the transmission frame includes a plurality of symbols constituting orthogonal frequency division multiplex,
- an orthogonal frequency division multiplex demodulator is connected upstream of the deinterleaving device, and
- refresh operation of the DRAM is performed during the guard interval.

9. A deinterleaving device according to claim 1, wherein a relationship between the inter-frame interleaving and the inter-segment interleaving satisfies a predetermined interleaving rule, the memory comprises a predetermined number of compartments,
- the data write section generates a frame counter value indicating which compartment of the predetermined number of compartments within the memory that the transmission frame being written corresponds to, and
- the data read section specifies in which compartment of the memory data is to be read from based on the frame counter value and the predetermined interleaving rule, and generates an address of data to be read from the specified compartment based on the predetermined interleaving rule.

10. A deinterleaving device according to claim 9, wherein the predetermined interleaving rule is $$R((Fc-r)+g\{R(m,r)\},C) \quad (A) \text{ and}$$

$$N \cdot Q(m,N)+h\{R(m,N)\} \quad (B), \text{ and}$$

the data read section specifies in which compartment of the memory data is to be read from based on the frame counter value and the expression (A), and generates the address of data from the specified compartment to be read based on the expression (B), where, N is the number of data, C is the number of compartments, m is an integer, R is the remainder when the integer m is divided by a natural number r, g is a function representing the rule of inter-frame interleaving, Fc is a value of the frame counter, Q is the quotient obtained when the integer m is divided by the natural number r, and h is an inverse function of a function representing the rule of inner-segment interleaving.

11. A deinterleaving device for deinterleaving an input transmission frame and outputting the deinterleaved frame, the transmission frame being obtained by performing inter-frame interleaving for an original frame to form an intermediate frame and performing inner-segment interleaving for at least one data segment included in the intermediate frame, the deinterleaving device comprising:
- a memory;
- a data write section for releasing the inter-frame interleaving and the inner-segment interleaving simultaneously when writing data in the memory; and
- a data read section for reading data from the memory and outputting the data.

12. A deinterleaving device according to claim 9, wherein the data write section receives data in a plurality of transmission frames, determines the order of the data in each of the transmission frames in a state where the inter-frame interleaving and the inner-segment interleaving are released by calculating backward a rearranging rule of the inner-segment interleaving and a rearranging rule of the inter-frame interleaving, and writes the data in the memory in the determined order.

13. A deinterleaving device according to claim 11, wherein the data segments are transmitted via sub-carriers included in at least one symbol constituting orthogonal frequency division multiplex, and
- the transmission frame includes a plurality of symbols constituting orthogonal frequency division multiplex.

14. A deinterleaving device according to claim 11, wherein the memory is a DRAM having a fast page mode, and a the data write section writes at least two consecutive data in the transmission frame at continuous addresses in the DRAM in the fast page mode.

15. A deinterleaving device according to claim 14, wherein the data segment is transmitted via sub-carriers included in at least one symbol constituting orthogonal frequency division multiplex,
- a guard interval is added to the symbol constituting orthogonal frequency division multiplex,
- the transmission frame includes a plurality of symbols constituting orthogonal frequency division multiplex,
- an orthogonal frequency division multiplex demodulator is connected upstream of the deinterleaving device, and
- refresh operation of the DRAM is performed during the guard interval.

16. A deinterleaving device according to claim 11, wherein a relationship between the inter-frame interleaving and the inter-segment interleaving satisfies a predetermined interleaving rule,
- the memory comprises a predetermined number of compartments,
- the data write section generates a frame counter value indicating which compartment of the predetermined number of compartments within the memory that data is to be written to, and for each data in the transmission frame, specifies in which compartment of the memory data is to be written to based on the frame counter value and the predetermined interleaving rule and generates an address in the specified compartment to write to based on the predetermined interleaving rule, and writes data at the generated address, and
- the data read section specifies in which compartment of the memory data is to be read from based on the frame counter value, and reads the data in the original frame sequentially from the compartment of the memory.

17. A deinterleaving device according to claim 16, wherein the predetermined interleaving rule is $$R((Fc+r)-g\{R(m,r)\},C) \quad \text{(A) and}$$

$$N \cdot Q(m,N)+h\{R(m,N)\} \quad \text{(B), and}$$

the data write section specifies in which compartment of the memory data is to be written to based on the frame counter value and the expression (A), and generates the address in which data is to be written to in the specified compartment based on the expression (B), where, N is the number of data, C is the number of compartments, m is an integer, R is the remainder when the integer m is divided by a natural number r, g is a function representing the rule of inter-frame interleaving, Fc is a value of the frame counter, Q is the quotient obtained when the integer m is divided by the natural number r, and h is an inverse function of a function representing the rule of inner-segment interleaving.

18. A deinterleaving device for deinterleaving an input transmission frame and outputting the deinterleaved frame, the transmission frame being obtained by performing inter-frame interleaving for an original frame including at least one channel to form an intermediate frame multiplexed by allocating the channel at a predetermined channel start position and performing inner-segment interleaving for at least one data segment included in the intermediate frame, the deinterleaving device comprising:
- a memory;
- a data write section for writing the transmission frame into the memory; and
- a data read section for releasing the inter-frame interleaving and the inner-segment interleaving for data in the channel simultaneously by referring to the channel start position of the channel when the channel start position is designated during reading of data from the memory, and outputting the data of the channel.

19. A deinterleaving device according to claim 18, wherein the data write section receives data in a plurality of transmission frames and stores the data in the memory, and
- the data read section determines the order of the data in each of the transmission frames in a state where the inter-frame interleaving and the inner-segment interleaving are released by calculating backward a rearranging rule of the inner-segment interleaving and a rearranging rule of the inter-frame interleaving, reads the data in the memory in the determined order, and outputs the data.

20. A deinterleaving device according to claim 18, wherein the data read section calculates a storage position of data in the memory based on the channel start position and the number of data read requests when the channel start position is designated during reading of data from the memory.

21. A deinterleaving device according to claim 18, wherein the data read section includes:
- a register for storing the channel start position;
- a counter for counting the number of data read requests; and
- an operator for calculating the storage position of data in the memory based on values of the register and the counter.

22. A deinterleaving device according to claim 18, wherein, during reading of data from the memory, when the data read section receives a channel multiplexing construction change signal indicating a change of a channel multiplexing construction of the original frame, the data read section releases the inter-frame interleaving and the inner-segment interleaving for data in the channel simultaneously by referring to an old channel start position before the receipt of the channel multiplexing construction change signal and a new channel start position after the receipt of the channel multiplexing construction change signal, and outputs the data of the channel.

23. A deinterleaving device according to claim 22, wherein when the data read section receives the channel multiplexing construction change signal, the data read section selects one of the old channel start position and the new channel start position based on the old and new channel start positions, the number of data read requests, and the number of transmission frames, and calculates the storage position of the data in the memory.

24. A deinterleaving device according to claim 22, wherein the data read section includes:
- a register for storing the old and new channel start positions and renewing the old and new channel start positions in response to the channel multiplexing construction change signal;
- a first counter for counting the number of data read requests;
- a second counter for counting the number of transmission frames, the second counter being initialized on receipt of the channel multiplexing construction change signal; and
- an operator for calculating a storage position of data in the memory based on values of the register, the first counter, and the second counter.

25. A deinterleaving device according to claim 18, wherein the transmission frame includes, at a stage of the intermediate frame, a data segment for which the inter-frame interleaving has been performed and a data segment for which the inter-frame interleaving has not been performed, the data write section writes the data segment for which the inter-frame interleaving has been performed and the data segment for which the inter-frame interleaving has not been performed into different storage positions of the memory, and the data read section releases the inter-frame interleaving and the inner-segment interleaving simultaneously for the data segment for which the inter-frame interleaving has been performed when reading data from the memory and outputs the data, while the data read section releases the inner-segment interleaving for the data segment for which the inter-frame interleaving has not been performed when reading data from the memory and outputs the data.

26. A deinterleaving device according to claim 18, wherein the data segments are transmitted via sub-carriers included in at least one symbol constituting orthogonal frequency division multiplex, and the transmission frame includes a plurality of symbols constituting orthogonal frequency division multiplex.

27. A deinterleaving device according to claim 18, wherein the memory is a DRAM having a fast page mode, and the data write section writes at least two consecutive data in the transmission frame at continuous addresses in the DRAM in the fast page mode.

28. A deinterleaving device according to claim 27, wherein the data segment is transmitted via sub-carriers included in at least one symbol constituting orthogonal frequency division multiplex, a guard interval is added to the symbol constituting orthogonal frequency division multiplex, the transmission frame includes a plurality of symbols constituting orthogonal frequency division multiplex, an orthogonal frequency division multiplex demodulator is connected upstream of the deinterleaving device, and refresh operation of the DRAM is performed during the guard interval.

29. A deinterleaving device according to claim 18, wherein a relationship between the inter-frame interleaving and the inter-segment interleaving satisfies a predetermined interleaving rule, the memory comprises a predetermined number of compartments, the data write section generates a frame counter value indicating which compartment of the predetermined number of compartments within the memory that the transmission frame being written corresponds to, and the data read section specifies in which compartment of the memory data is to be read from based on the channel start position, the frame counter value and the predetermined interleaving rule, and generates an address of data to be read from the specified compartment based on the predetermined interleaving rule.

30. A deinterleaving device according to claim 29, wherein the predetermined interleaving rule is $$R((Fc-r)+g\{R(m,r)\},C) \quad \text{(A) and}$$

$$N \cdot Q(m,N)+h\{R(m,N)\} \quad \text{(B), and}$$

the data read section specifies in which compartment of the memory data is to be read from based on the channel start position, the frame counter value and the expression (A), and generates the address of data from the specified compartment to be read based on the expression (B), where, N is the number of data, C is the number of compartments, m is an integer, R is the remainder when the integer m is divided by a natural number r, g is a function representing the rule of inter-frame interleaving, Fc is a value of the frame counter, Q is the quotient obtained when the integer m is divided by the natural number r, and h is an inverse function of a function representing the rule of inner-segment interleaving.

* * * * *

UNITED STATES PATENT AND TRADEMARK OFFICE
CERTIFICATE OF CORRECTION

PATENT NO. : 6,598,198 B1
DATED : July 22, 2003
INVENTOR(S) : Akihiro Furuta et al.

It is certified that error appears in the above-identified patent and that said Letters Patent is hereby corrected as shown below:

Column 18,
Line 47, please delete "9" and insert -- 11 --.
Line 65, please delete "and a the" and insert -- and the --.

Signed and Sealed this

Twenty-third Day of December, 2003

JAMES E. ROGAN
*Director of the United States Patent and Trademark Office*